(12) United States Patent
Cho et al.

(10) Patent No.: US 11,178,761 B1
(45) Date of Patent: Nov. 16, 2021

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Jung Hyun Cho, Suwon-si (KR); Kyung Hwan Ko, Suwon-si (KR); Chi Won Hwang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/953,726

(22) Filed: Nov. 20, 2020

(30) Foreign Application Priority Data

Jul. 31, 2020 (KR) .................. 10-2020-0095724

(51) Int. Cl.
  *H05K 1/11* (2006.01)
  *H05K 3/40* (2006.01)
  *H05K 1/18* (2006.01)

(52) U.S. Cl.
  CPC ............. *H05K 1/115* (2013.01); *H05K 1/111* (2013.01); *H05K 1/181* (2013.01); *H05K 3/4007* (2013.01); *H05K 3/4038* (2013.01); *H05K 2201/095* (2013.01); *H05K 2201/09827* (2013.01)

(58) Field of Classification Search
  CPC .... H05K 1/115; H05K 3/4038; H05K 3/4007; H05K 1/111; H05K 2201/095
  USPC ........................................................ 174/262
  See application file for complete search history.

(56) References Cited

U.S. PATENT DOCUMENTS

| 9,754,890 B2 * | 9/2017 | Deshpande ......... H01L 23/5385 |
| 11,094,637 B2 * | 8/2021 | Rubin ................. H01L 21/4853 |
| 2019/0198445 A1 | 6/2019 | Alur et al. |

FOREIGN PATENT DOCUMENTS

| KR | 10-2017-0111677 A | 10/2017 |
| KR | 10-2018-0044905 A | 5/2018 |
| WO | 2017/034641 A1 | 3/2017 |

* cited by examiner

*Primary Examiner* — Sherman Ng
(74) *Attorney, Agent, or Firm* — Morgan, Lewis & Bockius LLP

(57) ABSTRACT

A printed circuit board includes a printed circuit board includes a substrate portion having a recess portion and including a first circuit layer, abridge disposed in the recess portion and including an insulating layer and a bridge circuit layer, an insulating material disposed in at least a portion of the recess portion and covering at least a portion of the bridge, a second circuit layer disposed on the insulating material, and a first via penetrating through the insulating material and a portion of the bridge and connecting the second circuit layer and the bridge circuit layer to each other.

26 Claims, 33 Drawing Sheets

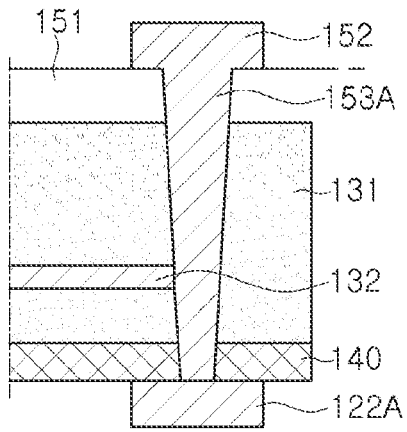 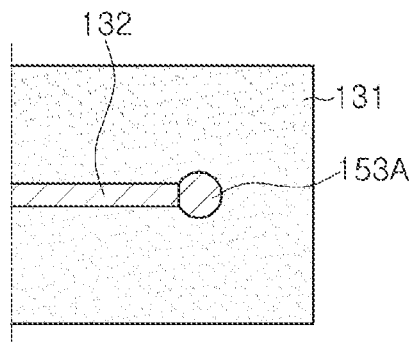
FIG. 6A  FIG. 6B
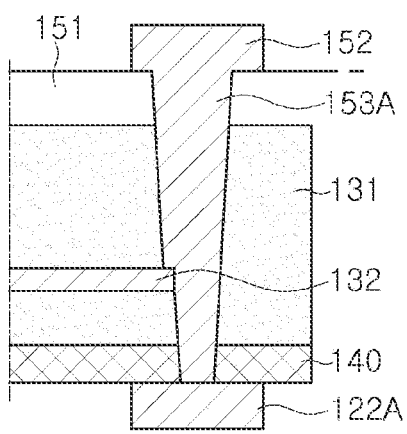 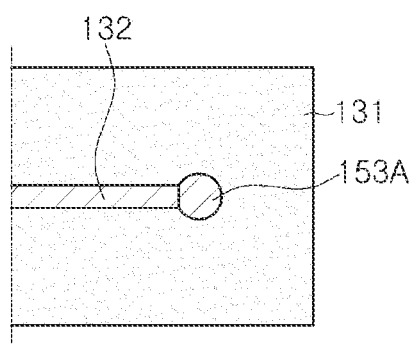
FIG. 6C  FIG. 6D
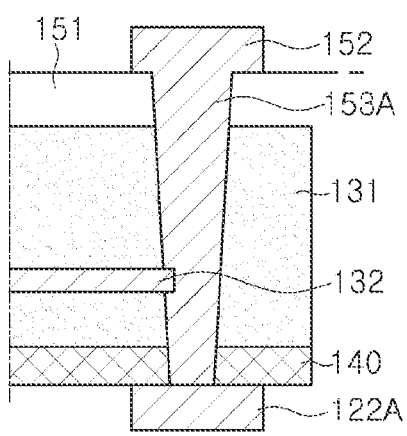 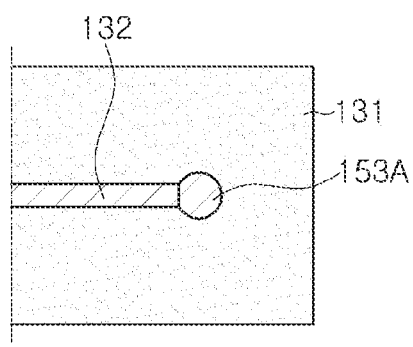
FIG. 6E  FIG. 6F

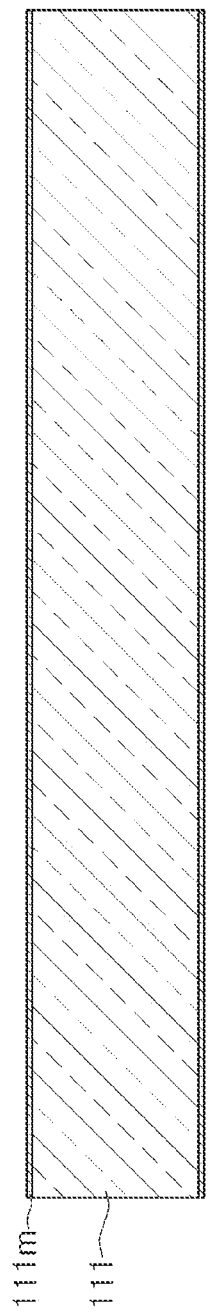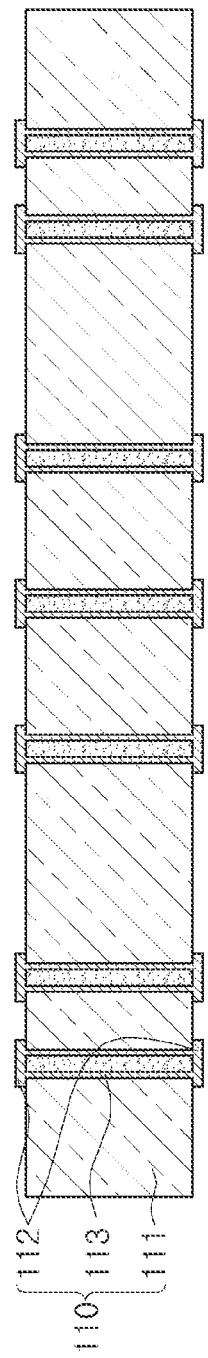

PRINTED CIRCUIT BOARD AND METHOD OF MANUFACTURING THE SAME

CROSS-REFERENCE TO RELATED APPLICATION(S)

The present application claims the benefit of priority to Korean Patent Application No. 10-2020-0095724, filed on Jul. 31, 2020 in the Korean Intellectual Property Office, the entire disclosure of which is incorporated herein by reference.

TECHNICAL FIELD

The present disclosure relates to a printed circuit board and a method of manufacturing the same.

BACKGROUND

With the recent development of artificial intelligence (AI) technology, and the like, a multichip package including a memory chip such as a high bandwidth memory (HBM) for processing exponentially increased data, and a process chip, such as a central processing unit (CPU), a graphics processing unit (GPU), an application specific integrated circuit (ASIC), a field programmable gate array (FPGA) or the like, has been used.

There is an ongoing development of a technology in which a bridge including a fine circuit is embedded in a printed circuit board, used in a multichip package, to electrically connect semiconductor chips mounted on a substrate.

SUMMARY

An aspect of the present disclosure is to provide a printed circuit board, in which a bridge including a high-density circuit layer is embedded, and a method of manufacturing the same.

Another aspect of the present disclosure is to provide a printed circuit board, capable of significantly reducing an electrical connection path by directly connecting a circuit layer of the printed circuit board and a bridge circuit layer of a bridge embedded in the printed circuit board, and a method of manufacturing the same.

According to an aspect of the present disclosure, a printed circuit board includes a substrate portion having a recess portion and including a first circuit layer, a bridge disposed in the recess portion and including an insulating layer and a bridge circuit layer, an insulating material disposed in at least a portion of the recess portion and covering at least a portion of the bridge, a second circuit layer disposed on the insulating material, and a first via penetrating through the insulating material and a portion of the bridge and connecting the second circuit layer and the bridge circuit layer to each other.

According to an aspect of the present disclosure, a method of manufacturing a printed circuit board includes forming a recess portion in a substrate portion including a first circuit layer, disposing a bridge, including an insulating layer and a bridge circuit layer, in the recess portion, forming an insulating material to fill at least a portion of the recess portion and to cover at least a portion of the bridge, and forming a first via penetrating through the insulating material and a portion of the bridge to be connected to the bridge circuit layer.

According to an aspect of the present disclosure, a printed circuit board includes a substrate portion having a recess portion and including a first circuit layer, a bridge disposed in the recess portion and including an insulating layer and a bridge circuit layer, an insulating material disposed in at least a portion of the recess portion and covering at least a portion of the bridge, a second circuit layer disposed on the insulating material, the bridge being disposed between the second circuit layer and the first circuit layer, and a first via connecting the first circuit layer and the bridge circuit layer to each other.

According to an aspect of the present disclosure, a method of manufacturing a printed circuit board includes forming a recess portion in a substrate portion to expose a first circuit layer of the substrate portion, disposing a bridge, including an insulating layer and a bridge circuit layer, in the recess portion, forming an insulating material to fill at least a portion of the recess portion and to cover at least a portion of the bridge, and forming a first via connect to the bridge circuit layer to the first circuit layer.

BRIEF DESCRIPTION OF DRAWINGS

The above and other aspects, features, and advantages of the present disclosure will be more clearly understood from the following detailed description, taken in conjunction with the accompanying drawings.

FIGS. 4A to 4F, 5A to 5F and 6A to 6F are schematic cross-sectional views and plan views illustrating enlarged views of a region of a first circuit layer and a first via of a printed circuit board according to the present disclosure.

FIGS. 9A to 9J are schematic views illustrating a process of manufacturing a printed circuit board according to the present disclosure.

DETAILED DESCRIPTION

Figure 1:
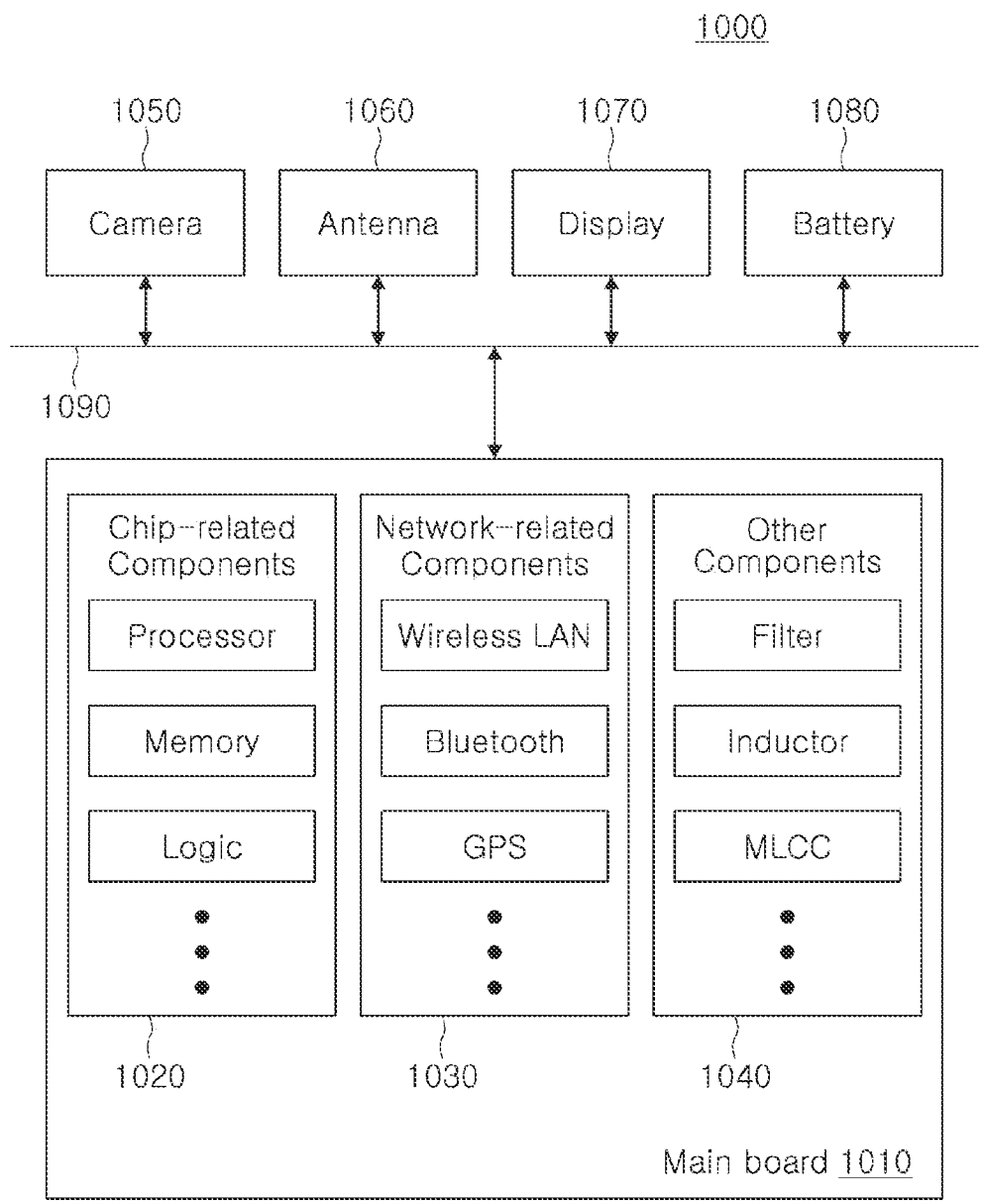
FIG. 1 is a schematic block diagram of an electronic device system according to an exemplary embodiment of the present disclosure.

Hereinafter, the present disclosure will be described with reference to the accompanying drawings. Shapes and sizes of the elements in the drawings may be exaggerated or reduced for clarity of description.

Electronic Device

FIG. 1 is a schematic block diagram of an electronic device system according to an exemplary embodiment.

Referring to FIG. 1, an electronic device 1000 may accommodate a mainboard 1010 therein. The mainboard 1010 may include chip-related components 1020, network-related components 1030, other components 1040, and the like, physically and/or electrically connected thereto. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components 1020 are not limited thereto, and may also include other types of chip related components. In addition, the chip-related components 1020 may be combined with each other. The chip-related component 1020 may be in the form of a package including the above-described chip or an electronic component.

The network-related components 1030 may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 and/or the network-related components 1030 described above.

Depending on a type of the electronic device 1000, the electronic device 1000 may include other components that may or may not be physically and/or electrically connected to the mainboard 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
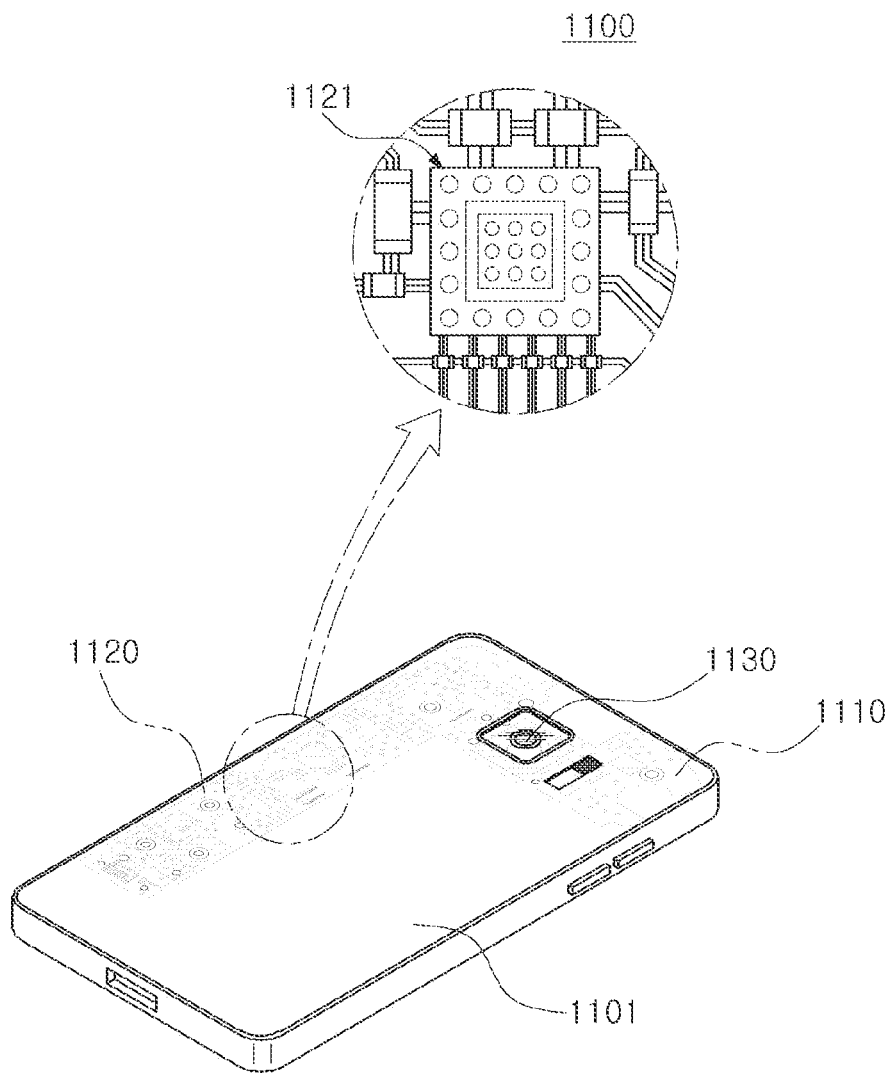
FIG. 2 is a schematic perspective view of an electronic device according to an exemplary embodiment of the present disclosure.

FIG. 2 is a schematic perspective view of an electronic device according to an exemplary embodiment.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other electronic components, such as a camera module 1130 and/or a speaker, which may or may not be physically and/or electrically connected to the mainboard 1110, may be accommodated therein. A portion of the electronic components 1120 may be the above-described chip related components, for example, a semiconductor package 1121, but are not limited thereto. The semiconductor package 1121 may be a surface on which a semiconductor chip or a passive component is mounted on a package substrate in a package substrate form, but is not limited thereto. The electronic device is not necessarily limited to the smartphone 1100, but may be other electronic devices as described above.

Printed Circuit Board

Figure 3:
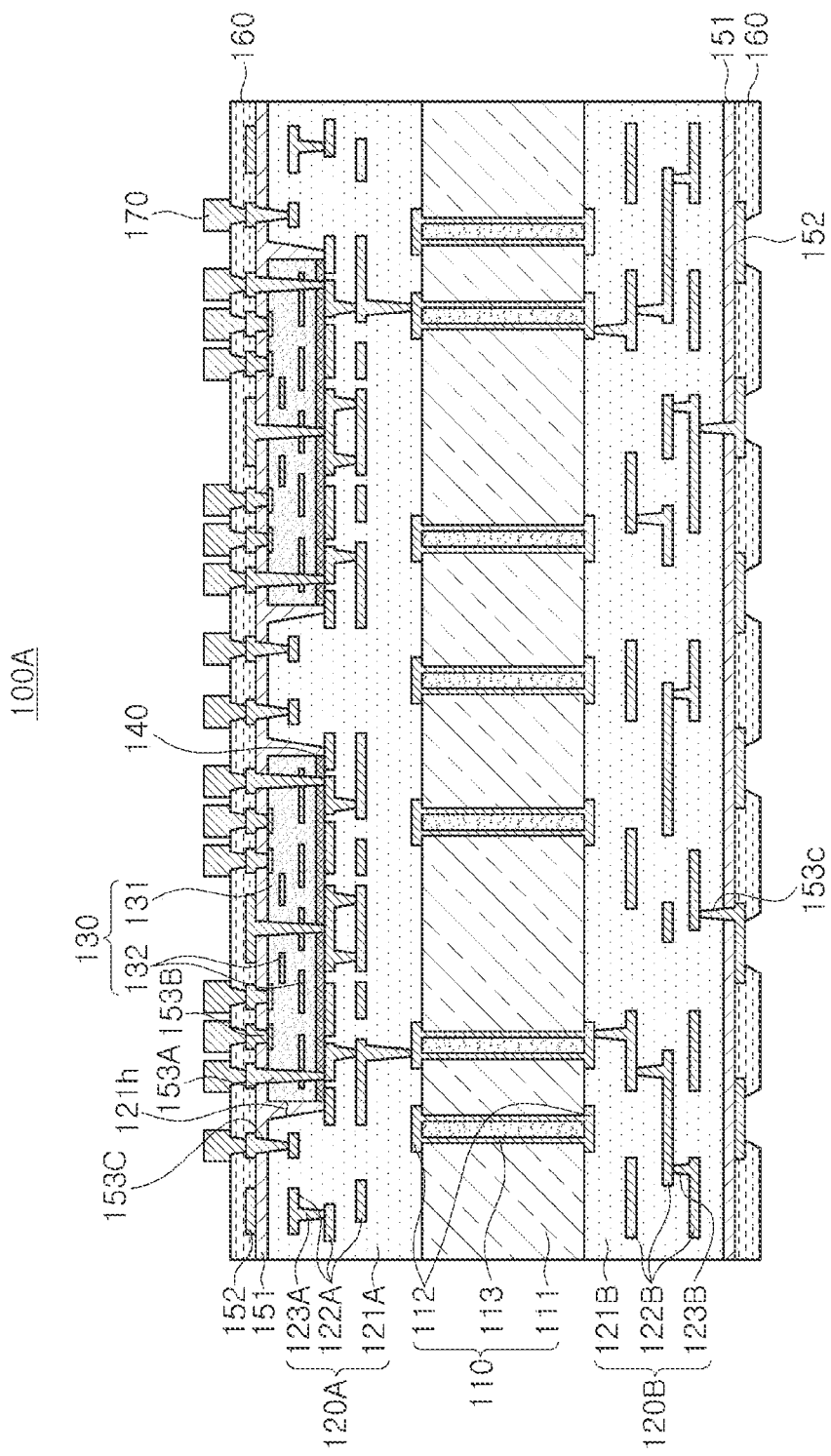
FIG. 3 is a schematic cross-sectional view of a printed circuit board according to an exemplary embodiment of the present disclosure.

FIG. 3 is a schematic cross-sectional view of a printed circuit board according to an exemplary embodiment of the present disclosure.

Referring to FIG. 3, a printed circuit board 100A according to an exemplary embodiment may include a core substrate portion 110, a first substrate portion 120A, a second substrate portion 120B, a bridge 130, an insulating material 151, a third circuit layer 152, a first via 153A, a second via 153B, and a third via 153C. However, the printed circuit board 100A may include only some of the first via 153A, the second via 153B, and the third via 153C. It is to be noted that the core substrate portion 110 and the second substrate portion 120B are additional components which may be omitted, similarly to a printed circuit board according to another exemplary embodiment to be described later.

The core substrate portion 110 may include a core layer 111, core circuit layers 112, respectively disposed on both surfaces of the core layer 111, and the through-vias 113 penetrating through the core layer 111 and connecting the core circuit layers 112, respectively disposed on both surfaces of the core layer 111, to each other. In FIG. 3, the core layer 111 is illustrated as being a single layer. However, the printed circuit board 100A may have a multilayer core substrate structure in which a plurality of core layers 111 are stacked, depending a design thereof.

The core layer 111 may promote rigidity to serve to suppress warpage of a substrate. The core layer 111 may have a greater thickness than each of the first insulating layer 121A and the second insulating layer 121B. A material for forming the core layer 111 is not necessarily limited, and may be any material as long as it has insulating properties. For example, the material for forming the core layer 111 may be a copper clad laminate (CCL) or an unclad copper clad laminate (unclad CCL). Alternatively, the material for forming the core layer 111 may be other types of material such as a glass substrate, a ceramic substrate, and the like, but is not limited thereto.

The core circuit layer 112 may include a ground (GND) pattern, a power (PWR) pattern, a signal (S) pattern, and the like, depending on a design thereof. A material for forming the core circuit layer 112 may be a conductive material and may be, for example, a known metal material available in the circuit layer.

A material for forming the through-via 113 may also be a conductive material. The through-via 113 may be formed by entirely filling a via hole with a conductive material, or the conductive material may be formed along a wall of the via hole. When the through-via 113 is formed of a conductive material along the wall of the via hole, the through-via may be filled with an insulating material.

The first substrate portion 120A may have a recess portion 121h and may include a first circuit layer 122A, embedded in the first insulating layer 121A, and a first via layer 123A embedded in the first insulating layer 121A and connecting the first circuit layers 122A disposed on different layers. In this case, the number of each of the first insulating layer 121A, the first circuit layer 122A, and the first via layer 123A, included in the first substrate portion 120A, is not necessarily limited.

As illustrated in the drawing, the first substrate portion 120A may be disposed on one surface of the core substrate portion 110, and a surface opposing a surface, on which the recess portion 121h is formed, may be disposed to face the core substrate portion 110.

The recess portion 121h may penetrate through at least a portion of the first insulating layer 121A. As illustrated in the drawing, the recess portion 121h may have a shape in which a width thereof is decreased in a direction penetrating through the first insulating layer 121A toward the core substrate 110, but may have a shape in which the width thereof is constant in the direction penetrating through the first insulating layer 121A. A circuit pad, included in the first circuit layer 122A, may be disposed in at least a certain region of a bottom surface of the recess portion 121h, which will be described later.

The first insulating layer 121A may be formed by stacking a plurality of insulating layers. In this case, boundaries between a plurality of insulating layers may be distinguished. Alternatively, the plurality of insulating layers may be integrated such that boundaries therebetween may not be readily apparent. A material for forming the first insulating layer may be an insulating material and may be, for example, a prepreg (PPG), or the like.

The first circuit layer 122A may be connected to at least one of the first circuit layer 122A, the core circuit layer 112, and the third circuit layer 152 disposed on another layer. The first circuit layer 122A may perform various functions, depending on a design thereof. For example, the first circuit layer 122A may include a ground (GND) pattern, a power (PWR) pattern, a signal (S) pattern, and the like. A material for forming the first circuit layer 122A may be a conductive material. For example, the material for forming the first circuit layer 122A may be a known metal material available in a circuit layer. The first circuit layer 122A may include a circuit pad disposed in at least a certain region of the bottom surface of the recess portion 121h.

The first via layer 123A may penetrate through a portion of the first insulating layer 121A to connect the first circuit layer 122A to the first circuit layer 122A, disposed on another layer, and/or the core circuit layer 112. A material for forming the first via layer 123A may also be a conductive material, and a known shape such as a tapered shape or a cylindrical shape may be applied thereto.

The second substrate portion 120B may include a second insulating layer 121B, a second circuit layer 122B embedded in the second insulating layer 121B, and a second via layer 123B embedded in the second insulating layer 121B and connecting the second circuit layers 122B, disposed on different layers, to each other.

The second substrate portion 120B may be disposed on the other surface, a surface opposing the one surface of the core substrate portion 110 on which the first substrate portion 120A is disposed.

A recess portion may not be formed in the second substrate portion 120B and the bridge 130 may not be disposed on a side surface of the second substrate portion 120B, unlike the first substrate portion 120A.

A description of each of the second insulating layer 121B, the second circuit layer 122B, and the second via layer 123B may be applied the same as the description of each of the first insulating layer 121A, the first circuit layer 122A, and the first via layer 123A.

The bridge 130 may be disposed on the first substrate portion 120A. As illustrated in the drawing, the bridge 130 may be disposed in the recess portion 121h. The bridge 130 may include an insulating layer 131 and a bridge circuit layer 132, and the bridge circuit layer 132 may include a plurality of bridge circuit layers 132. In addition, the insulating layer 131 may also include a plurality of insulating layers 131. The bridge 130 serves to electrically connect a plurality of semiconductor chips, mounted on the substrate, to each other.

The insulating layer 131 may be an organic insulating layer, but is not limited thereto and may be formed of insulating materials such as glass, silicon, and ceramic. When the insulating layer 131 is an organic insulating layer, the bridge 130 may be manufactured through a known process of manufacturing a printed circuit board in which a plurality of insulating layers are stacked.

The bridge circuit layer 132 may be a high-density circuit layer, and may have a higher density than the first circuit layer 122A. In addition, the bridge circuit layer may have higher density than the second circuit layer 122B. Accordingly, the bridge circuit layer 132 may have a finer circuit than the first circuit layer 122A and/or the second circuit layer 122B. The bridge circuit layer 132 may be in contact with the first via 153A, and may be connected to each of the third circuit layer 152 and the first circuit layer 122A through the first via 153A. In addition, the bridge circuit layer 132 may be connected to the third circuit layer 152 through the second via 153B.

The printed circuit board 100A according to an exemplary embodiment may further include an adhesive layer 140 disposed between a bottom surface of the recess portion 121h and the bridge 130. The adhesive layer 140 may serve to fix the bridge 130 to the bottom surface of the recess portion 121h. In this case, the first via 153A may penetrate through the insulating material 151 and the bridge 130 to further penetrate through the adhesive layer 140. A material for forming the adhesive layer 140 may be a known tape, or the like.

The insulating material 151 may fill at least a portion of the recess portion 121h, and may cover at least a portion of the bridge 130. For example, the insulating material 151 may fill a space between the recess portion 121h and the bridge 130, and may extend upwardly of each of the recess portion 121h and the bridge 130 to cover one surface of each of the recess portion 121h and the bridge 130. A material for forming the insulating material 151 may be an insulating material. The material for forming the insulating material 151 may be, for example, an Ajinomoto Build-up Film (ABF), but is not limited thereto.

The third circuit layer 152 may be disposed on the insulating material 151, and may be connected to at least one of the first circuit layer 122A and the bridge circuit layer 132. The third circuit layer 152 may include a ground (GND) pattern, a power (PWR) pattern, a signal (S) pattern, and the like, depending on a design thereof. A material for forming the third circuit layer 152 may be a conductive material. The material for forming the third circuit layer 152 may be, for example, a known metal material available in the circuit layer.

The printed circuit board 100A according to an exemplary embodiment may have at least one of a first via 153A, a second via 153B, and a third via 153C.

The first via 153A may penetrate through the insulating material 151 and the bridge 130 to connect the third circuit layer 152 and the first circuit layer 122A. In this case, the first via 153A may be in contact with each of the third circuit layer 152 and the first circuit layer 122A to directly connect the third circuit layer 152 and the first circuit layer 122A to each other. When the printed circuit board 100A according to an exemplary embodiment further includes the adhesive layer 140, the first via 153A may further penetrate through the adhesive layer 140. The first via 153A and the third circuit layer 152 may be integrated such that a boundary therebetween may be apparent.

Since in the printed circuit board 100A according to an exemplary embodiment, the first via 153A may penetrate through the insulating material 151 and the bridge 130 to directly connect the third circuit layer 152 and the first circuit layer 122A to each other, an electrical connection path between the third circuit layer 152 and the first circuit layer 122A may be significantly reduced.

Figure 15:
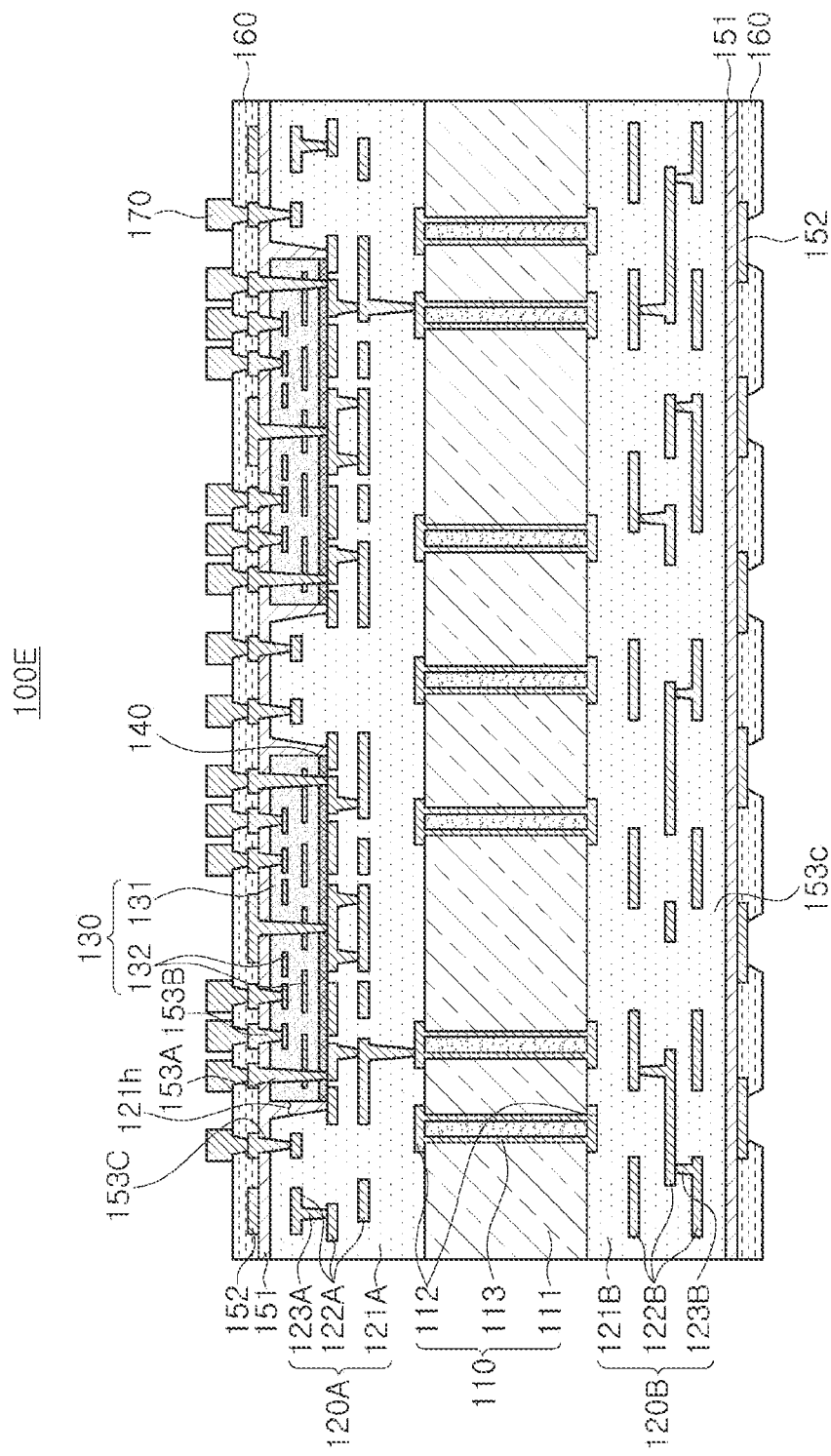
FIG. 15 is a schematic cross-sectional view illustrating another example of the printed circuit board according to the present disclosure.

The second via 153B may penetrate through the insulating material 151, and may connect the third circuit layer 152 and the bridge circuit layer 132 to each other. As illustrated in FIG. 15, when the second via 153B is connected to the bridge circuit layer 132 embedded in the bridge 130, the second via 153B may penetrate through the insulating material 151 and a portion of the bridge 130. In this case, the second via 153B may penetrate through the insulating material 151 and a portion of the insulating layer 131. The second via 153B and the third circuit layer 152 may be integrated. However, the present disclosure is not limited thereto, and the second via 153B and the third circuit layer 152 may be disposed such that a boundary therebetween is apparent.

The third via 153C penetrate through the insulating material 151 and the first insulating layer 121A, and may connect the third circuit layer 152 and the first circuit layer 122A to each other. Unlike what is illustrated in the drawing, a portion of the first circuit layers 122A may be exposed upwardly of the first insulating layer 121A to be covered with an insulating material 151. In this case, the third via 153C may penetrate through only the insulating material 151. The third via 153C and the third circuit layer 152 may be integrated. However, the present disclosure is not limited thereto, and the third via 153C and the third circuit layer 152 may be disposed such that a boundary therebetween is apparent.

A material for forming each of the first via 153A, the second via 153B, and the third via 153C may also be a conductive material. Each of the first via 153A, the second via 153B, and the third via 153C may have a known shape such as a tapered shape, a cylindrical shape, or the like.

The printed circuit board 100A according to an exemplary embodiment may further include a protective layer 160 disposed on the insulating material 151 and having an opening exposing at least a portion of the third circuit layer 152. A material for forming the protective layer 160 may be an insulating material. The material for forming the protective layer 160 may be, for example, a solder resist.

The printed circuit board 100A according to an exemplary embodiment may further include a connection conductor 170 disposed on the protective layer 160 to be connected to the third circuit layer 152. A material for forming the connection conductor 170 may be a conductive material. The material for forming the connection conductor 170 may be, for example, a conductive post and/or a solder ball.

As illustrated the drawing, at least one of the insulating material 151, the third circuit layer 152, the via 153, and the protective layer 160 may also be disposed on the second substrate portion 120B. In this case, since the second substrate portion 120B does not have a recess portion, the insulating material 151 may be formed to cover one surface of the second substrate portion 120B. However, the insulating material 151 may not be disposed on the second substrate portion 120B and the third circuit layer 152 may be directly disposed on the second insulating layer 121B, depending on designs thereof.

FIGS. 4A to 4F, 5A to 5F and 6A to 6F are schematic cross-sectional views and plan views illustrating enlarged views of a region of a first circuit layer and a first via of a printed circuit board according to the present disclosure.

Figure 4A:
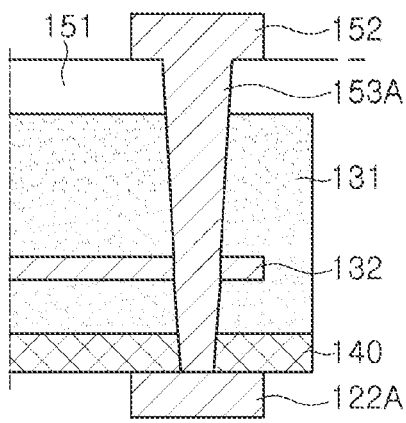
Figure 4B:
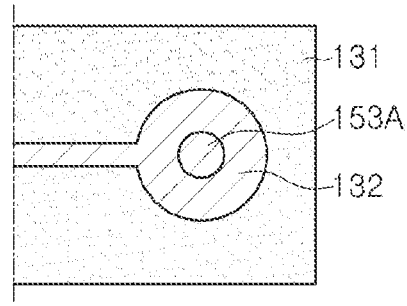

FIGS. 4A and 4B are a cross-sectional view and a plan view illustrating a region of a bridge circuit layer 132 and a first via 153A of a printed circuit board 100A according to an exemplary embodiment, respectively.

Referring to FIGS. 4A and 4B, the bridge circuit layer 132 may include a bridge circuit pattern in contact with a side surface of the first via 153A.

The bridge circuit pattern may include a region having a hole. For example, the bridge circuit pattern may have a ring shape. In this case, when a via hole for forming the first via 153A is formed, the via hole may penetrate through a region corresponding to the hole of the bridge circuit pattern, and may expose at least a portion of a side surface of the bridge circuit pattern. Thus, the first via 153A may fill the hole of the bridge circuit pattern, and the bridge circuit pattern may surround a side surface of the first via 153A in a region in contact with the side surface of the first via 153A.

Figure 4C:
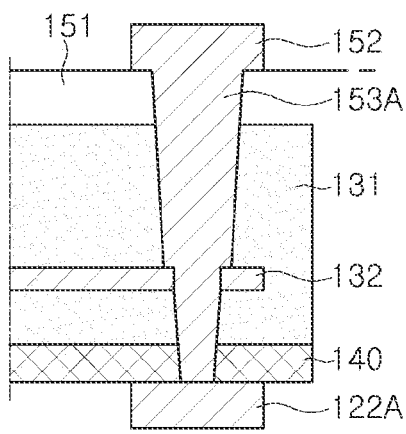
Figure 4D:
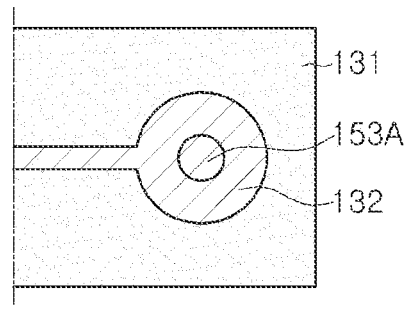

FIGS. 4C and 4D are a cross-sectional view and a plan view of a region of a bridge circuit layer 132 and a first via 153A according to a modified example of an exemplary embodiment, respectively.

When a via hole for forming the first via 153A is processed, the via hole may be processed to have a diameter greater than a diameter of a hole of a bridge circuit pattern. In this case, one surface of a bridge circuit pattern may not be processed and may remain in a region in which the via hole is formed. Accordingly, at least a portion of the one surface of the bridge circuit pattern may be exposed through the via hole, and the first via 153A, filling the via hole, may cover the exposed surface of the bridge circuit pattern. In this case, the exposed one surface of the bridge circuit pattern may be a surface facing a third circuit layer 152.

The via hole may be further processed along a circumference of the hole of the bridge circuit pattern. In this case, since the bridge circuit pattern is not processed, a further processed lower via hole region may have a width narrower than a width of an upper via hole region exposing the bridge circuit pattern. Thus, the first via 153A may have a step from an interface of the first via 153A and the insulating layer 131 to an interface of the first via 153A and a side surface of the bridge circuit pattern of the bridge circuit layer 132.

Figure 4E:
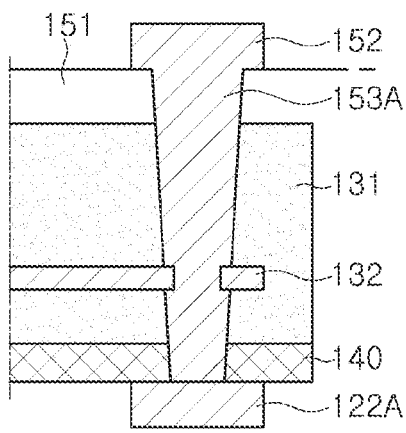
Figure 4F:
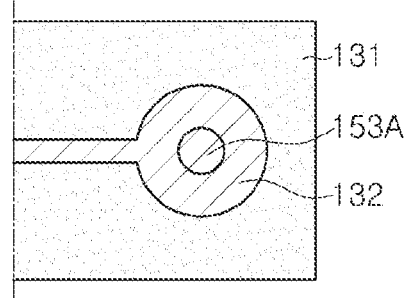

FIGS. 4E and 4F are a cross-sectional view and a plan view of a region of a bridge circuit layer 132 and a first via 153A according to a modified example of an exemplary embodiment, respectively.

As described above, a via hole may be further processed along a circumference of a hole of the bridge circuit pattern. In this case, the further processed lower via hole may have a greater diameter than the hole of the bridge circuit pattern. Accordingly, at least a portion of the bridge circuit pattern, which is in contact with the side surface of the first via 153A, may protrude to a region of the via hole. In this case, the first via 153A may have a step from an interface of the first via 153A and the insulating layer 131 to an interface of the first via 153A and a side surface of the bridge circuit pattern of the bridge circuit layer 132.

Figure 5A:
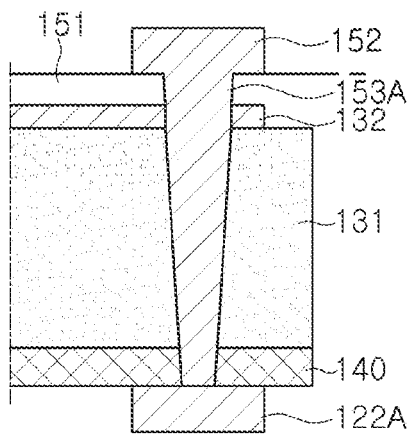
Figure 5B:
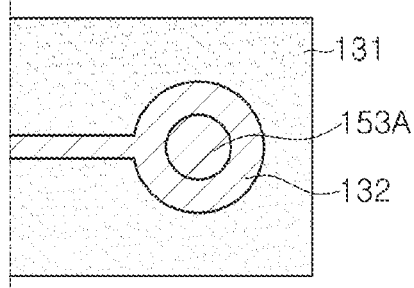

FIGS. 5A and 5B are a cross-sectional view and a plan view of a bridge circuit layer 132 and a first via 153A according to another embodiment, respectively.

Referring to FIGS. 5A and 5B, in the structure illustrated in FIGS. 4A and 4B, the bridge circuit layer 132 is not embedded in the insulating layer 131 and is disposed on one surface of the insulating layer 131.

Figure 5C:
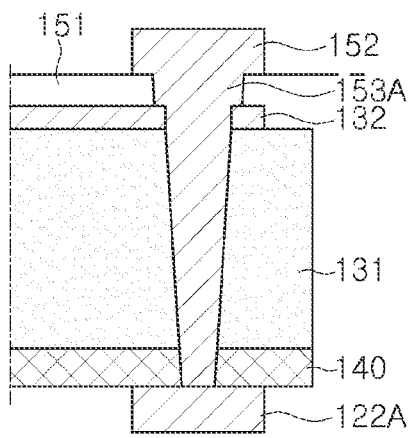
Figure 5D:
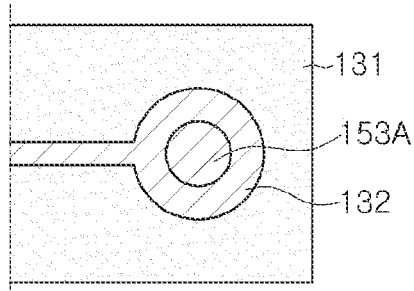

FIGS. 5C and 5D are a cross-sectional view and a plan view of a region of a bridge circuit layer 132 and a first via 153A according to a modified example of another embodiment, respectively.

Referring to FIGS. 5C and 5D, as described above in the description of FIGS. 4C and 4D, when a via hole for forming the first via 153A is processed, the via hole may be processed to have a diameter greater than a diameter of a hole of a bridge circuit pattern. Thus, the first via 153A may have a step from an interface of the first via 153A and the insulating layer 131 to an interface of the first via 153A and a side surface of the bridge circuit pattern of the bridge circuit layer 132. In this case, one surface of a bridge circuit pattern may not be processed and may remain in a region in which the via hole is formed. Accordingly, at least a portion of one surface of the bridge circuit pattern may be exposed through the via hole, and the first via 153A filling the via hole may cover the exposed surface of the bridge circuit pattern. In this case, the one exposed surface of the bridge circuit pattern may be a surface facing the third circuit layer 152.

Figure 5E:
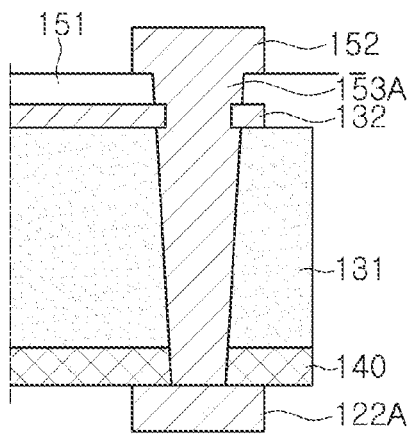
Figure 5F:
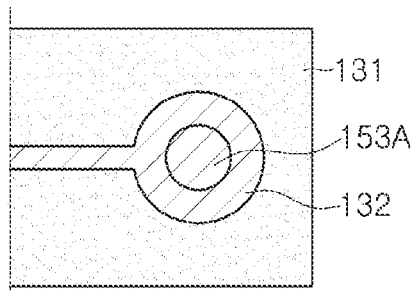

FIGS. 5E and 5F are a cross-sectional view and a plan view of a region of a bridge circuit layer 132 and a first via 153A according to a modified example of another embodiment, respectively.

As described above, a via hole may be further processed along a circumference of a hole of a bridge circuit pattern. In this case, a region of the further processed lower via hole may have a greater diameter than the hole of the bridge circuit pattern. Accordingly, at least a portion of the bridge circuit pattern, which is in contact with a side surface of the first via 153A, may protrude to a via hole region. In this case, the first via 153A may have a step from an interface of the first via 153A and the insulating layer 131 to an interface of the first via 153A and a side surface of the bridge circuit pattern of the bridge circuit layer 132.

FIGS. 6A and 6B are a cross-sectional view and a plan view of abridge circuit layer 132 and a first via 153A according to another embodiment, respectively.

Referring to FIGS. 6A and 6B, in the structure illustrated in FIGS. 4A and 4B, the bridge circuit pattern does not have a region in which a hole is formed, and an end portion of the bridge circuit pattern is in contact with a side surface of the first via 153A.

When a via hole for forming the first via 153A is processed, a via hole may be formed to be adjacent to an end portion of a bridge circuit pattern. When the via hole is formed in such a manner, the via hole may expose a side surface of the bridge circuit pattern. Accordingly, a first via 153A filling the via hole may be in contact with the exposed side surface of the bridge circuit pattern.

FIGS. 6C and 6D are a cross-sectional view and a plan view of a region of a bridge circuit layer 132 and a first via 153A according to a modified example of another embodiment, respectively.

Referring to FIGS. 6C and 6D, when a via hole for forming the first via 153A is processed, one surface of a bridge circuit pattern may not be processed and may remain in a region in which the via hole is formed. Accordingly, at least a portion of one surface of the bridge circuit pattern may be exposed through the via hole, and the first via 153A filling the via hole may cover the exposed surface of the bridge circuit pattern. Thus, the first via 153A may have a step from an interface of the first via 153A and the insulating layer 131 to an interface of the first via 153A and a side surface of the bridge circuit pattern of the bridge circuit layer 132. In this case, the one exposed surface of the bridge circuit pattern may be a surface facing the third circuit layer 152.

FIGS. 6E and 6F are a cross-sectional view and a plan view of a region of a bridge circuit layer 132 and a first via 153A according to a modified example of another embodiment, respectively.

As described above, a via hole may be further processed along a circumference of a hole of a bridge circuit pattern. In this case, a region of a further processed lower via hole may have a greater diameter than a region of the via hole disposed on a side portion of the bridge circuit pattern. Thus, the first via 153A may have a step from an interface of the first via 153A and the insulating layer 131 to an interface of the first via 153A and a side surface of the bridge circuit pattern of the bridge circuit layer 132. Accordingly, at least a portion of the bridge circuit pattern, which is in contact with a side surface of the first via 153A, may protrude to a via hole region.

FIGS. 7A to 7D and 8A to 8D are schematic plan views illustrating an enlarged view and a modified example of a first circuit layer region disposed on a bottom surface of a recess portion of a printed circuit board according to the present disclosure.

A first circuit layer 122A of a printed circuit board 100A according to an exemplary embodiment may include a circuit pad disposed in at least a certain portion of a bottom surface of a recess portion 121h. In this case, a first via 153A may be in contact with the circuit pad to connect the circuit pad and a third circuit layer 152 to each other.

Figure 7A:
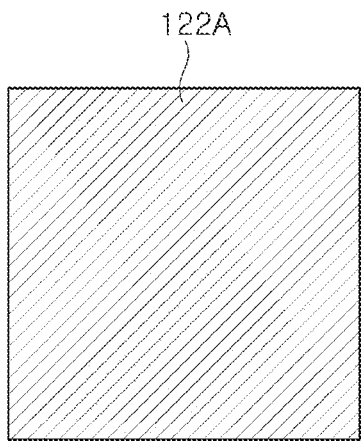
FIGS. 7A to 7D and 8A to 8D are schematic plan views illustrating an enlarged view and a modified example of a first circuit layer region disposed on a bottom surface of a recess portion of a printed circuit board according to the present disclosure.
Figure 7B:
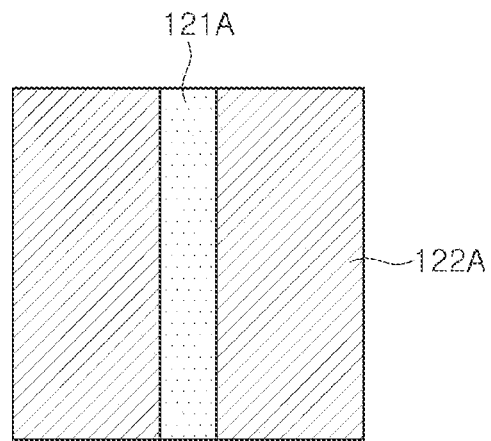
Figure 7C:
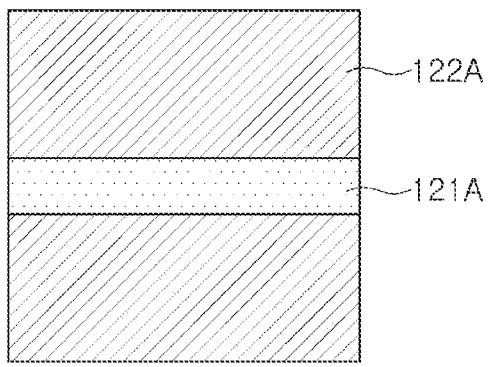
Figure 7D:
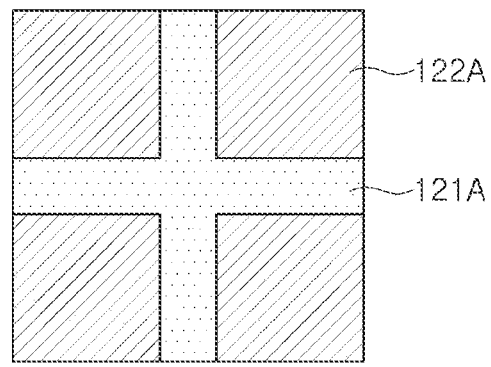

Referring to FIG. 7A, the circuit pad of the first circuit layer 122A may be a single pad, and may be disposed to cover an entire bottom surface of the recess portion 121h.

Referring to FIGS. 7B to 7D and FIGS. 8A and 8B, a circuit pad of the first circuit layer 122A may include a plurality of circuit pads, and each of the plurality of circuit pads may be disposed to be spaced apart from each other. In this case, each of the plurality of circuit pads may have various shapes such as a rectangle or a circle.

Figure 8A:
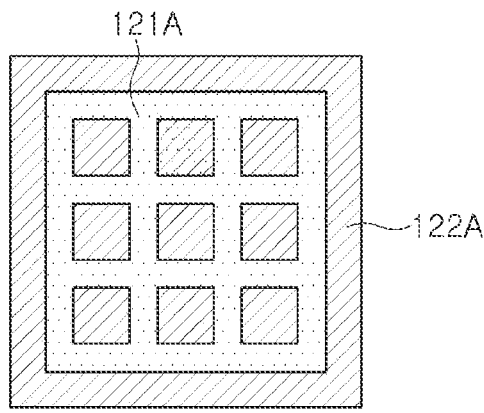
Figure 8B:
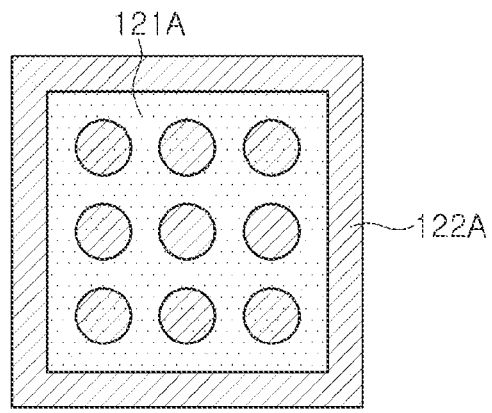
Figure 8C:
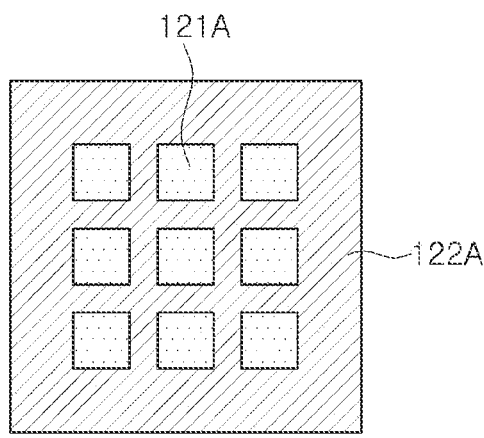
Figure 8D:
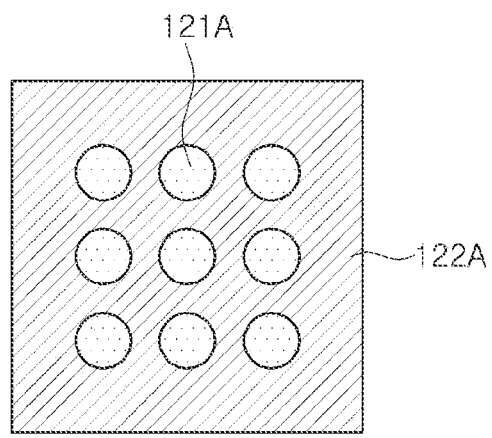

Referring to FIGS. 8C and 8D, the circuit pad of the first circuit layer 122A may have at least one hole, and a certain region of the first insulating layer 121A may be exposed through a hole. In this case, the hole formed in the circuit pad may perform degassing.

The circuit pad, included in the first circuit layer 122A, may have various shapes, and thus, may play various roles, depending on a design thereof. For example, each of the circuit pads may serve as a ground (GND) pad, a power (PWR) pad, a signal (S) pad, and the like, and may provide an electrical path for a variety of purposes.

FIGS. 9A to 9J are schematic views illustrating a process of manufacturing a printed circuit board according to the present disclosure.

Referring to FIG. 9A, a core layer 111 may be prepared. The core layer 111 may be a metal clad laminate having both surfaces to which metal clads (each having a thickness of 111m) are attached, respectively.

Referring to FIG. 9B, core circuit layers 112 may be formed on both surfaces of the core layer 111, respectively. A through-via 113 may be formed to penetrate through the core layer 111 and to connect the core circuit layers 112, disposed on both surfaces of the core layer 111, to each other. The core circuit layer 112 and the through-via 113 may be formed through a known plating process after a via hole is formed using laser drilling, mechanical drilling, or the like. In this case, a metal clad 111m may serve as a seed layer.

Figure 9C:
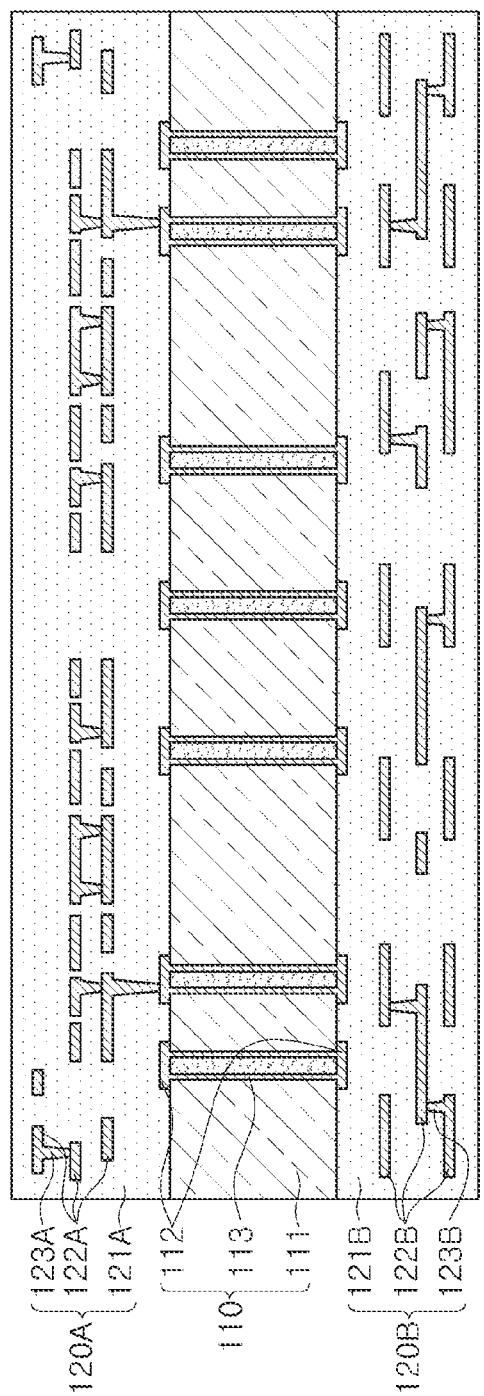

Referring to FIG. 9C, a first substrate portion 120A and a second substrate portion 120B may be formed on one surface and the other surface of the core substrate portion 110, respectively. The first substrate portion 120A may include a first insulating layer 121A, a first circuit layer 122A, and a first via layer 123A. The second substrate portion 120B may include a second insulating layer 121B, a second circuit layer 122B, and a second via layer 123B.

Each of the first insulating layer 121A and the second insulating layer 121B may be formed by stacking one or more insulating layers. For example, each of the first insulating layer 121A and the second insulating layer 121B may be formed by laminating an uncured prepreg and curing the laminated prepreg, but the present disclosure is not limited thereto.

Each of the first circuit layer 122A, the second circuit layer 122B, the first via layer 123A, and the second via layer 123B may also be formed through a known plating process after a via hole is formed using laser drilling, mechanical drilling, or the like.

Figure 9D:
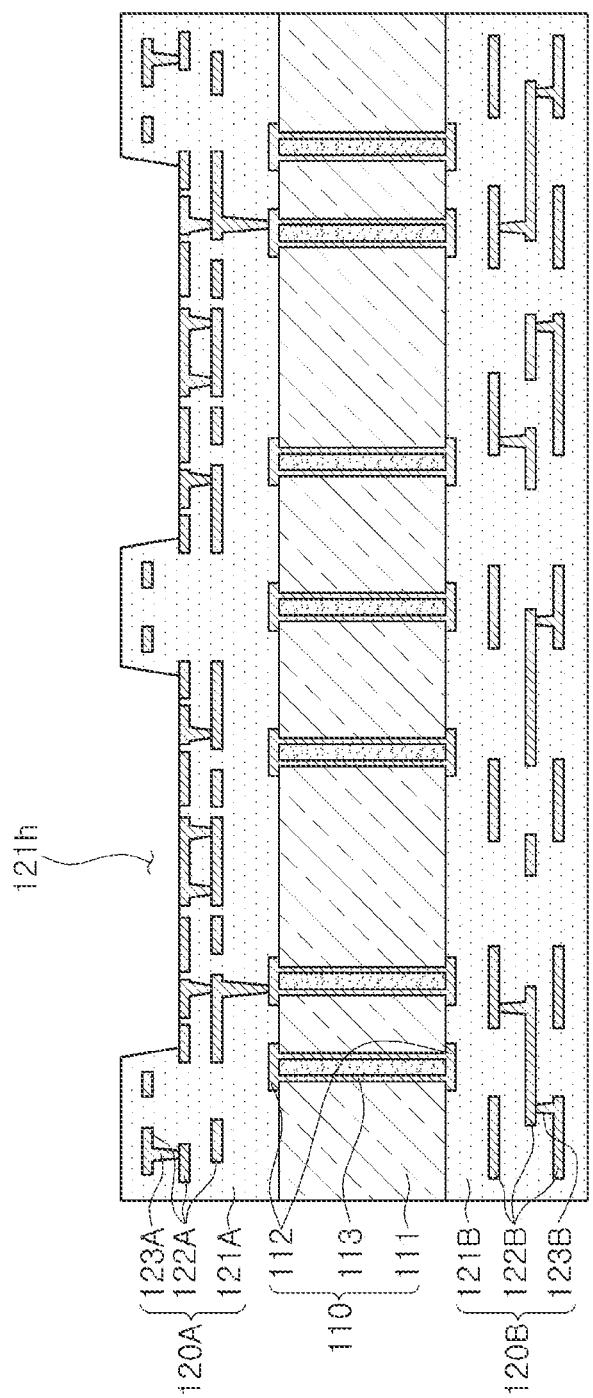

Referring to FIG. 9D, a recess portion 121h may be formed on the first substrate portion 120A. A method of forming the recess portion 121h is not necessarily limited, and may be a known method such as laser drilling, mechanical drilling, or the like. The recess portion 121h may be formed to penetrate through only a portion of the first substrate portion 120A. In this case, a circuit pad included in the first circuit layer 122A may serve as a processing stop layer. Accordingly, the recess portion 121h may expose at least a portion of the circuit pad, and the circuit pad may be disposed in at least a portion of the bottom surface of the recess portion 121h. In this case, the first insulating layer 121A may be processed more deeply in a region in which the circuit pad is not formed. Accordingly, the bottom surface of the recess portion 121h may have a step with respect to one surface of the circuit pad of the first circuit layer 122A exposed through the recess portion 121h. In addition, the bottom surface of the recess portion 121h may have an uneven structure. For example, the bottom surface in one region of the recess portion 121h may be disposed on a higher or lower level than the bottom surface in the other region of the recess portion 121h.

Figure 9E:
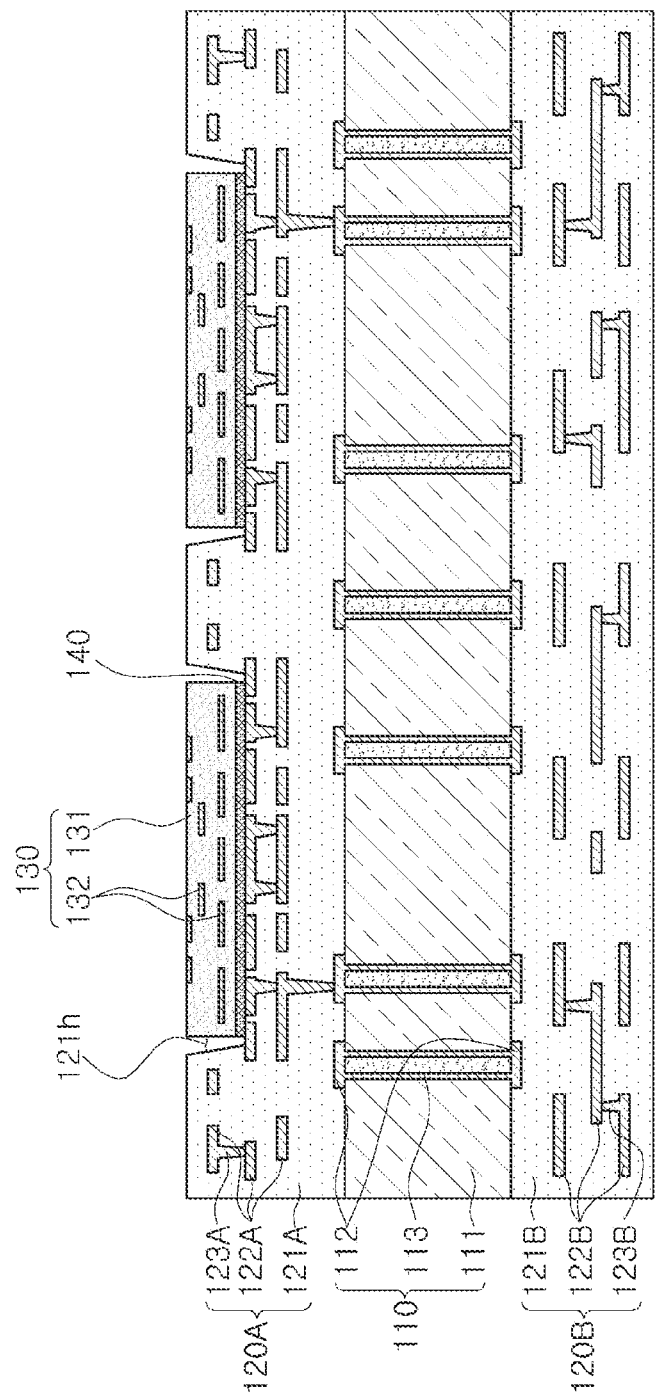

Referring to FIG. 9E, a bridge 130 may be provided in the recess portion 121h. In this case, the bridge 130 may be provided in such a manner that it is fixed to a bottom surface of the recess portion 121h through an adhesive layer 140.

Figure 9F:
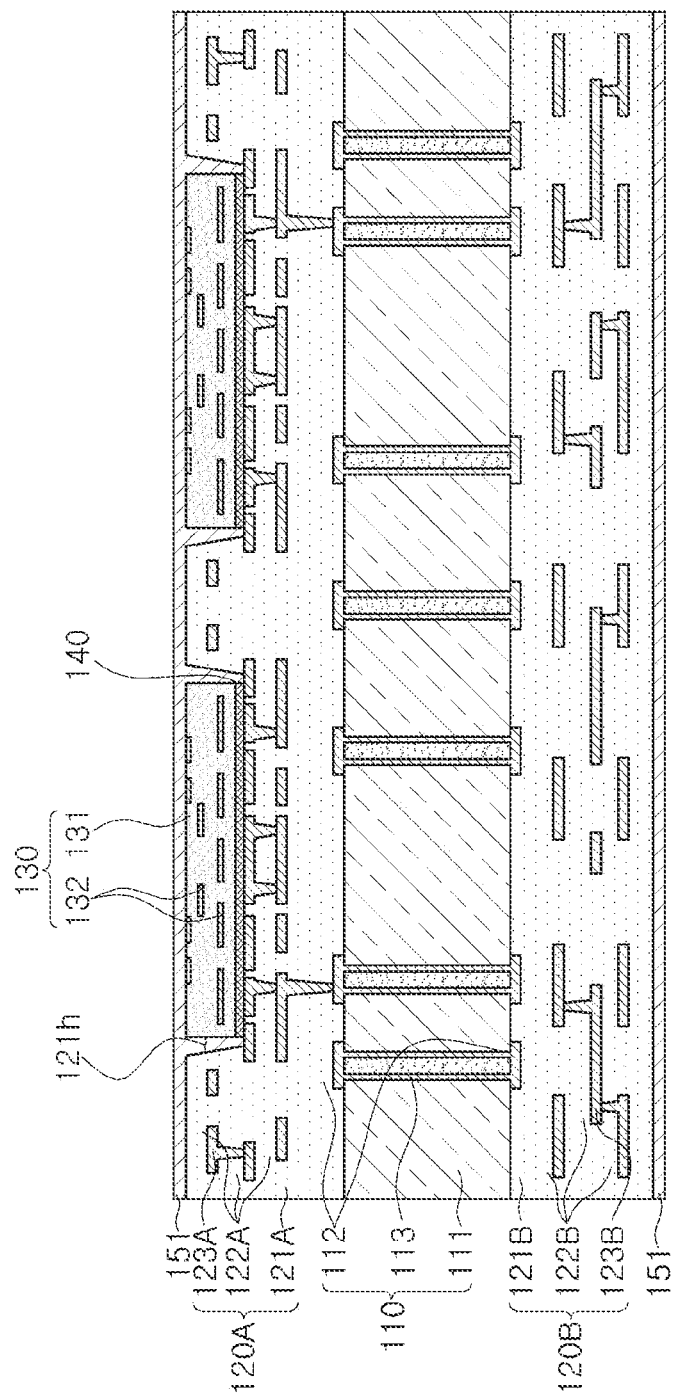

Referring to FIG. 9F, an insulating material 151 may be formed on the first substrate portion 120A. In this case, the insulating material 151 may also be formed on the second substrate portion 120B. The insulating material 151 may be formed to fill at least a portion of the recess portion 121h and cover at least a portion of the bridge 130. The insulating material 151 may be formed by laminating an Ajinomoto Build-up Film (ABF) and curing the laminated ABF.

Figure 9G:
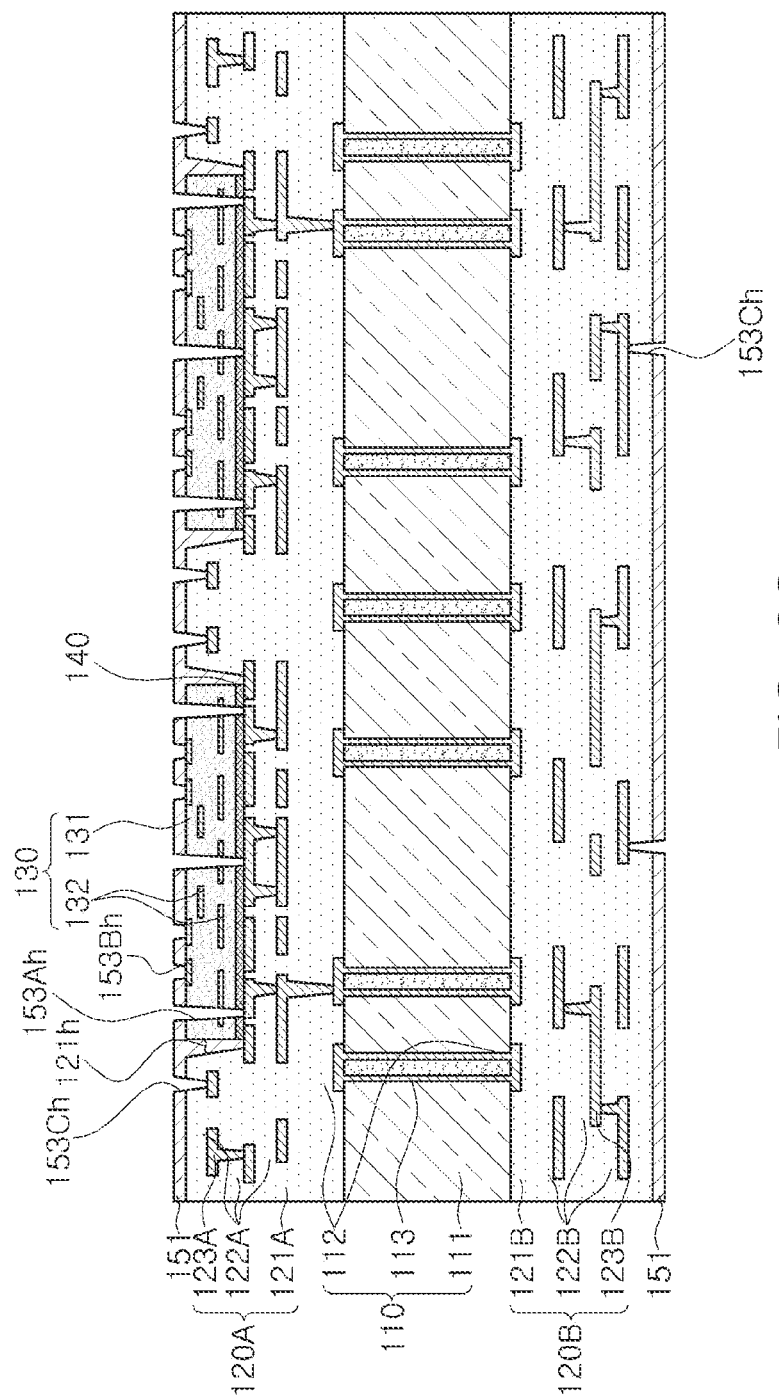

Referring to FIG. 9G, a first via hole 153Ah, a second via hole 153Bh, and a third via hole 153Ch may be formed. Each of the first via hole 153Ah, the second via hole 153Bh, and the third via hole 153Ch may be formed using laser drilling, mechanical drilling, or the like. The first via hole 153Ah may be formed to penetrate through the insulating material 151 and the bridge 130 and to further penetrate through the adhesive layer 140. The second via hole 153Bh may be formed to penetrate through the insulating material 151, and may be formed to further penetrate through a portion of the bridge 130. The third via hole 153Ch may be formed to penetrate through the insulating material 151 and the first insulating layer 121A, and may be formed to penetrate only the insulating material 151. Each of the first via hole 153Ah, the second via hole 153Bh, and the third via hole 153Ch may be formed using laser drilling, mechanical drilling, or the like.

Figure 9H:
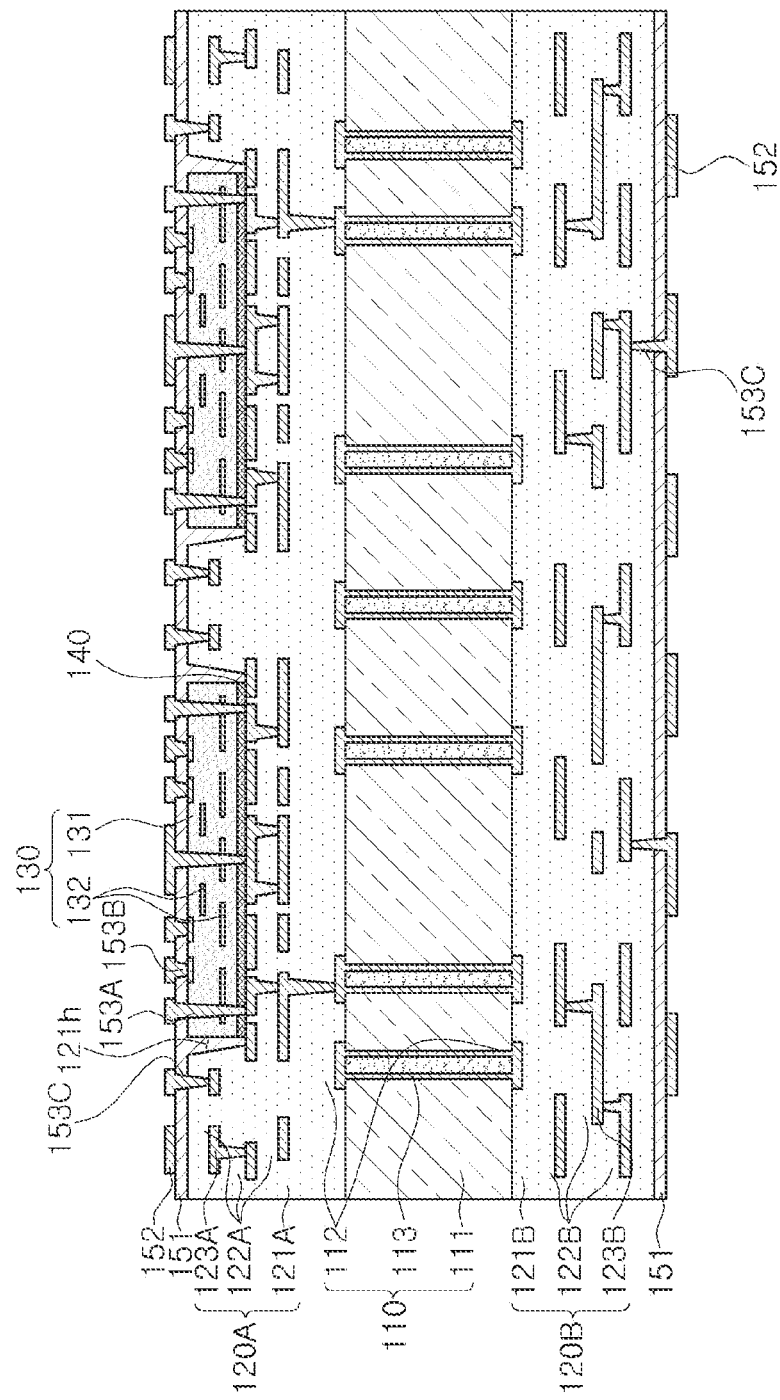

Referring to FIG. 9H, the first via hole 153Ah, the second via hole 153Bh, and the third via hole 153Ch may be filled to form a first via 153A, a second via 153B, and a third via 153C, respectively, and a third circuit layer 152 may be formed on the insulating material 151. Each of the first via 153A, the second via 153B, the third via 153C, and the third circuit layer 152 may be formed through a known plating process, which will be described later in detail with reference to FIGS. 10 to 11.

Figure 9I:
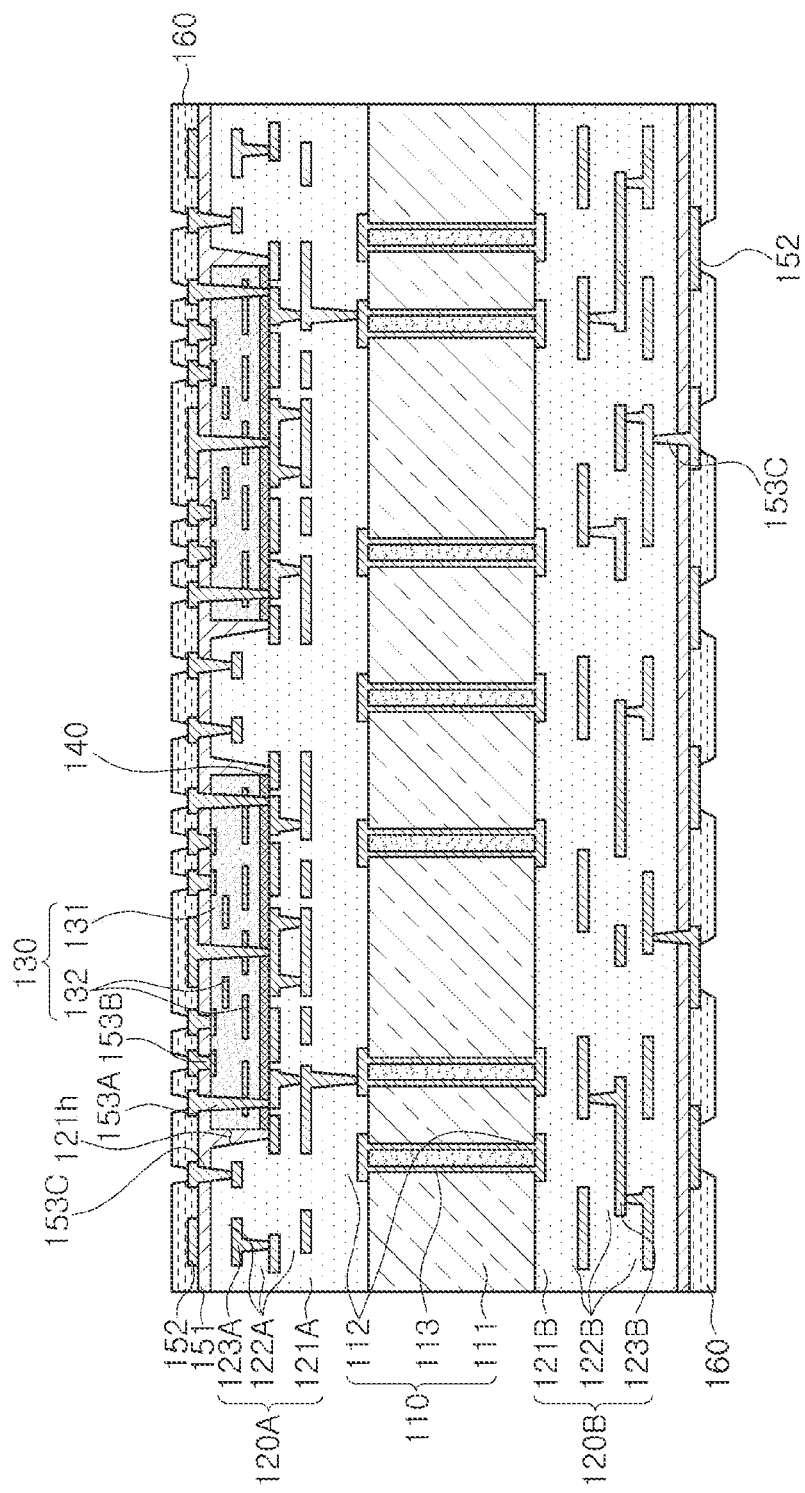

Referring to FIG. 9I, a protective layer 160 may be formed on the insulating material 151. The protective layer 160 may be formed by laminating an insulating material such as a solder resist and curing the laminated insulating material. In addition, an opening may be formed in the protective layer 160 to expose at least a portion of the third circuit layer 152.

Figure 9J:
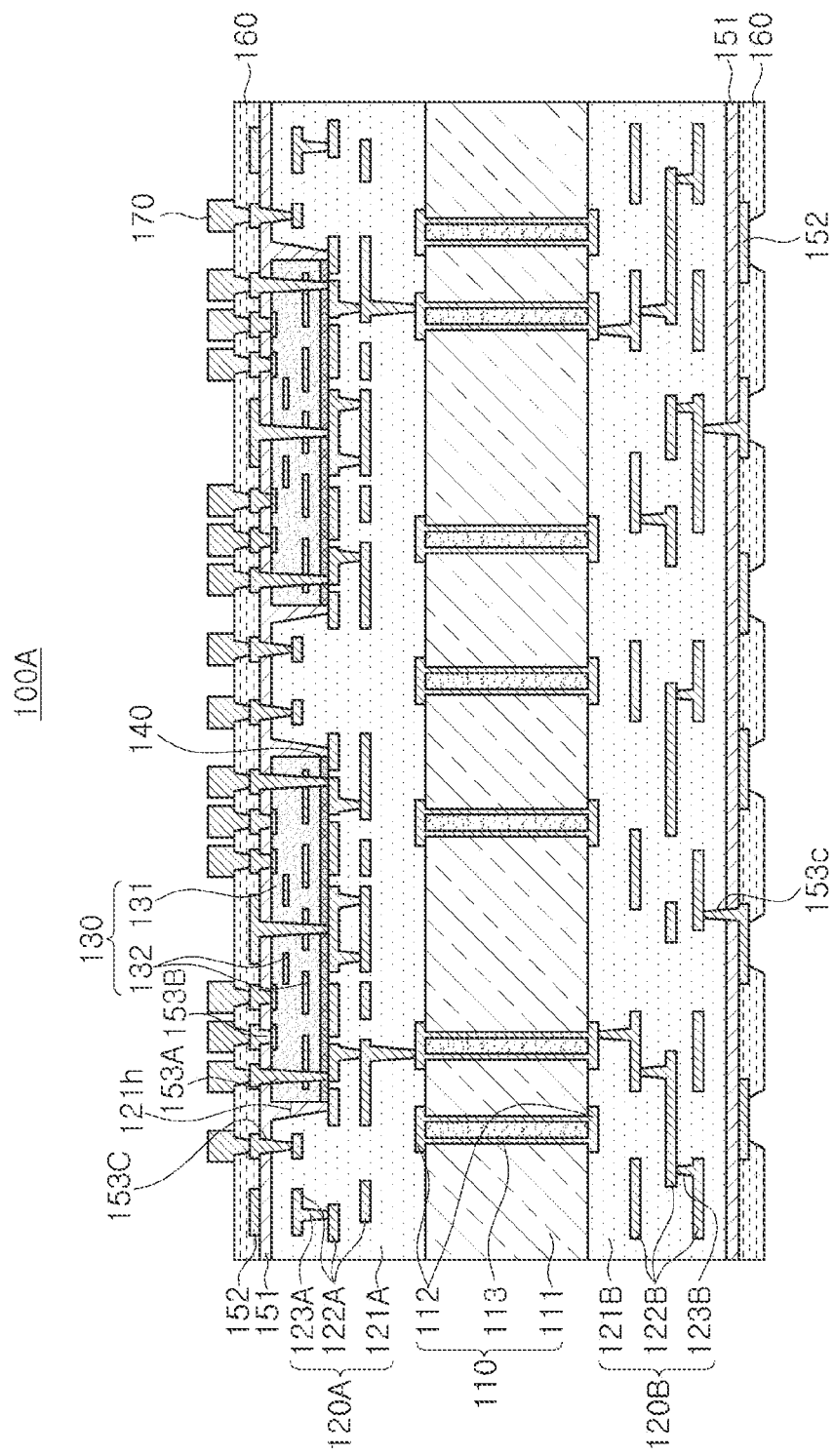

Referring to FIG. 9J, a connection conductor 170 may be formed on the protective layer 160. The connection conductor 170 may be formed through a known plating process, and may be formed to fill the opening, formed in the protective layer 160, to be connected to the third circuit layer 152.

FIGS. 10A to 10D are schematic views illustrating an example of a process of forming first to third vias and a third circuit layer of a printed circuit board according to the present disclosure.

Figure 10A:
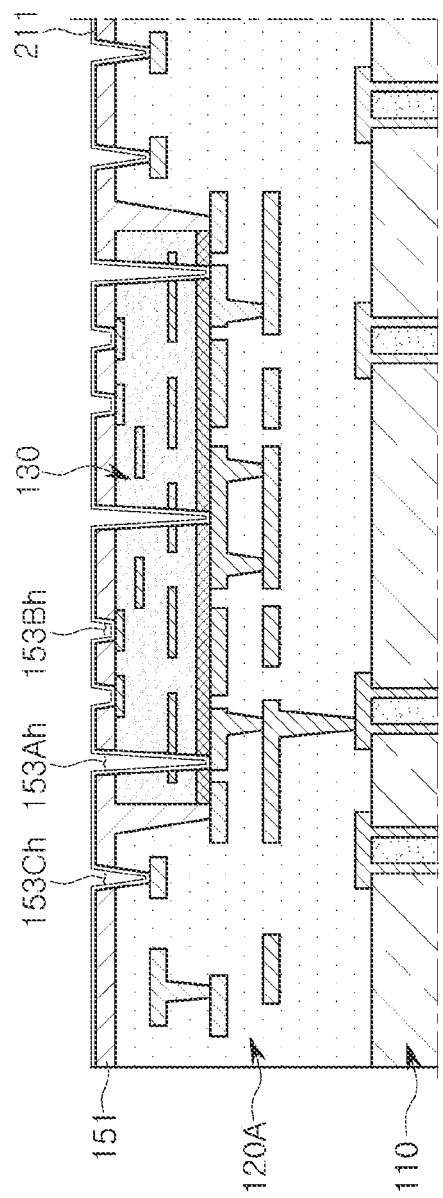
FIGS. 10A to 10D are schematic views illustrating an example of a process of forming first to third vias and a third circuit layer of a printed circuit board according to the present disclosure.

Referring to FIG. 10A, a first via hole 153Ah may be formed to penetrate through the insulating material 151, the bridge 130, and the adhesive layer 140, a second via hole 153Bh may be formed to penetrate through the insulating material 151, and a third via hole 153Ch may be formed to penetrate through the first insulating layer 121A. In addition, a first metal layer 211 is formed along a surface of the insulating material 151 and a wall surface of each of the first via hole 153Ah, the second via hole 153Bh, and the third via hole 153Ch. The first metal layer 211 may be formed by electroless plating, and may serve as a seed layer.

Figure 10B:
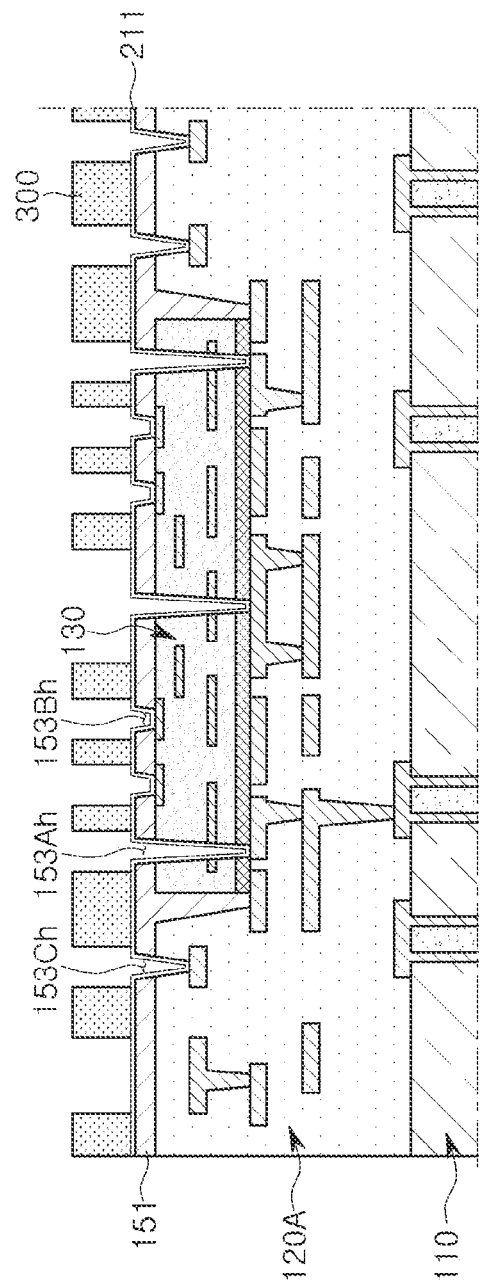

Referring to FIG. 10B, a photoresist layer 300 may be formed on the insulating material 151. In this case, an opening may be formed in the photoresist layer 300 in a region, in which the first via 153A, the second via 153B, the third via 153C, and the third circuit layer 152 are formed, through exposure and development processes.

Figure 10C:
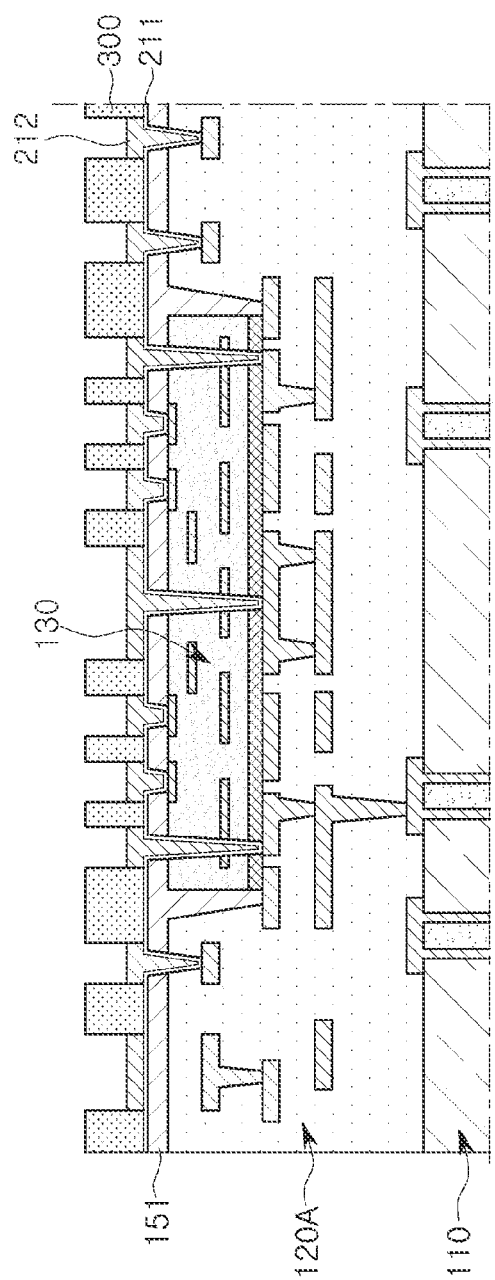

Referring to FIG. 10C, a first metal layer 211 may be formed on the first metal layer 211 in the region in which the first via 153A, the second via 153B, the third via 153C, and the third circuit layer 152 are formed. The second metal layer 212 may be formed by electroplating.

Figure 10D:
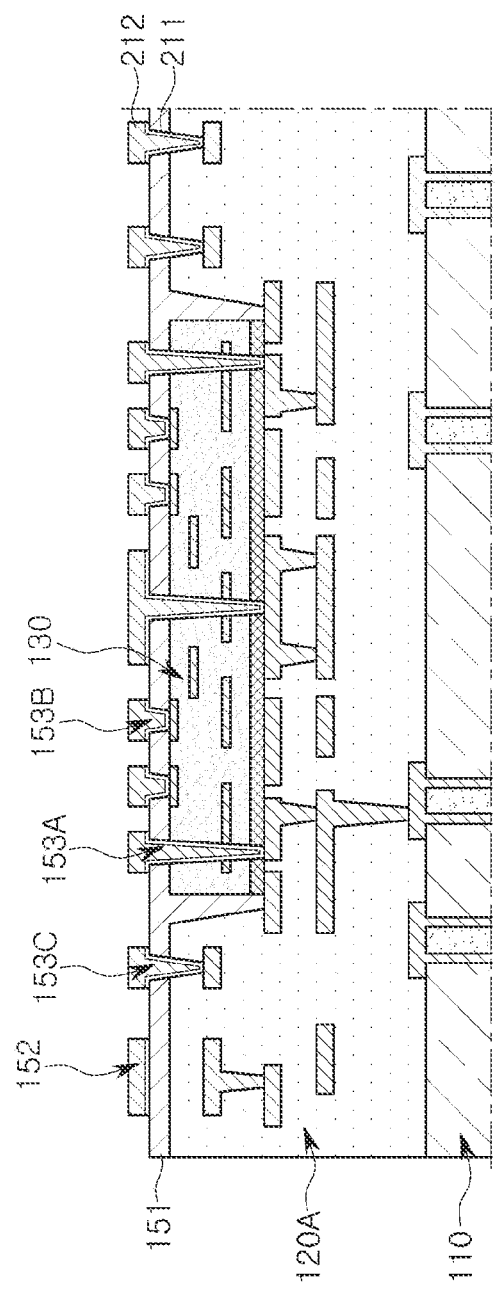

Referring to FIG. 10D, the photoresist layer 300 and the first metal layer 211, covered with the photoresist layer 300, may be removed. The photoresist layer 300 may be delaminated to be removed, and the first metal layer 211 may be etched to be removed.

In the manufacturing process according to an exemplary embodiment, each of the first via 153A, the second via 153B, the third via 153C, and the third circuit layer 152 may include a first metal layer 211 and a second metal layer 212. Each of the first via 153A, the second via 153B, and the third via 153C may be formed together with the third circuit layer 152 to be integrated with the third circuit layer 152.

FIGS. 11A to 11G are schematic views illustrating another example of a process of forming first to third vias and a third circuit layer of a printed circuit board according to the present disclosure.

Figure 11A:
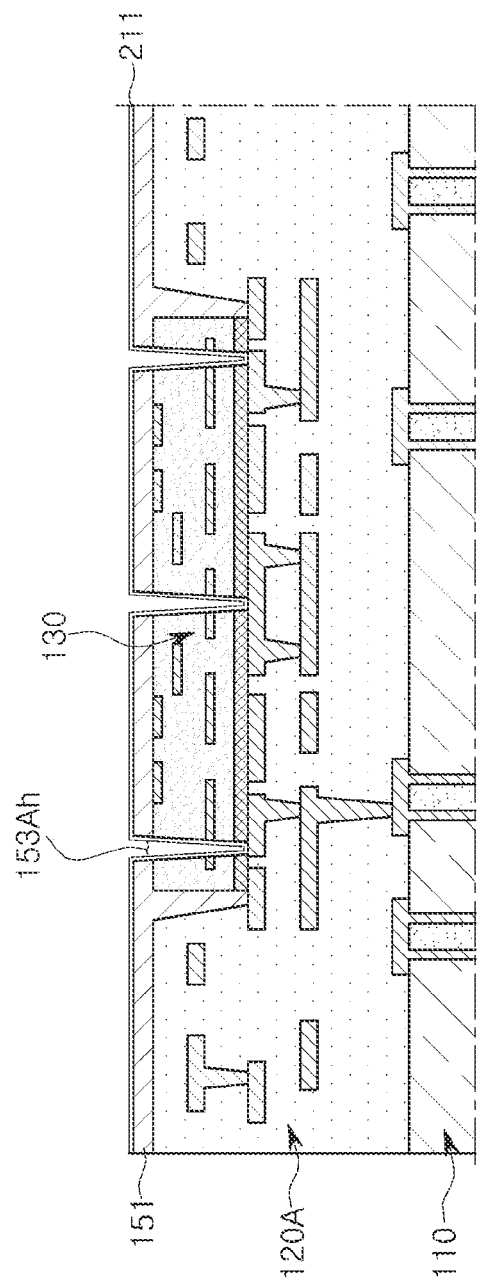
FIGS. 11A to 11G are schematic views illustrating another example of a process of forming first to third vias and a third circuit layer of a printed circuit board according to the present disclosure.

Referring to FIG. 11A, a first via hole 153Ah may be formed to penetrate through an insulating material 151, abridge 130, and a adhesive layer 140, and a first metal layer 211 may be formed along a surface of the insulating material and a wall surface of the first via hole 153Ah. The first metal layer 211 may be formed by electroless plating, and may serve as a seed layer.

Figure 11B:
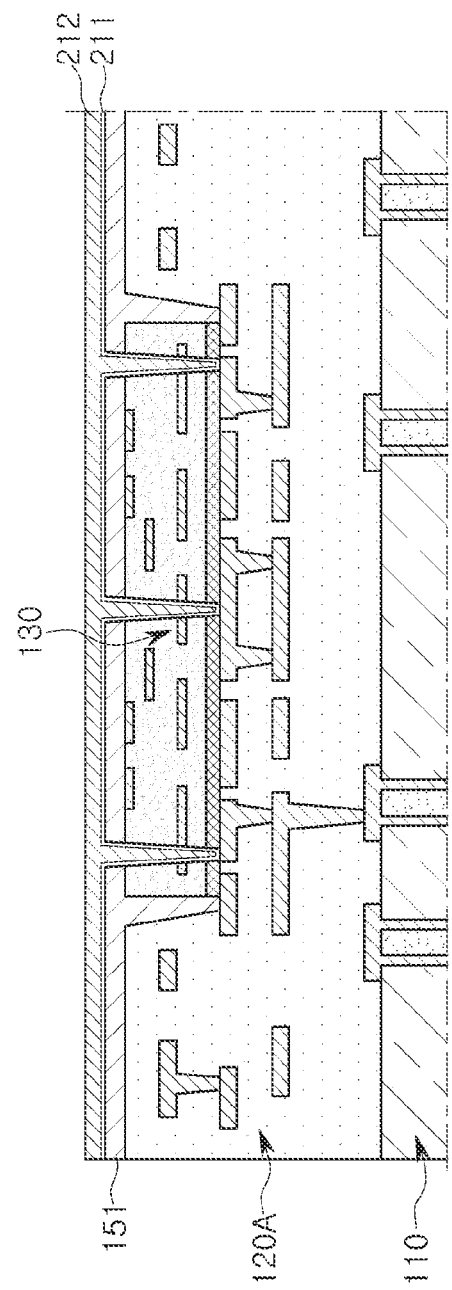

Referring to FIG. 11B, a second metal layer 212 may be formed on the first metal layer 211. The second metal layer 212 may be formed by electroplating.

Figure 11C:
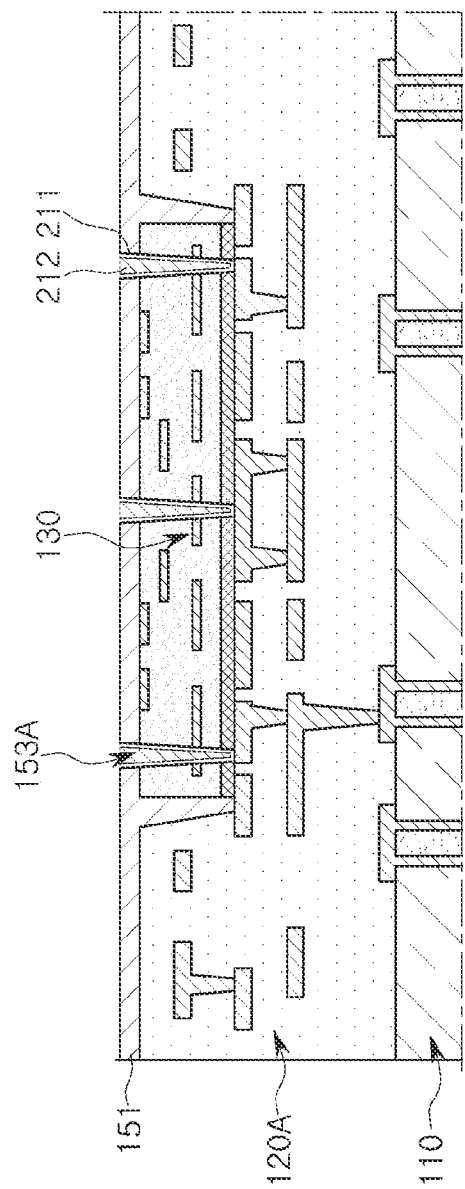

Referring to FIG. 11C, the first metal layer 211 and the second metal layer 212, disposed on one surface of the insulating material 151, may be removed. The first metal layer 211 and the second metal layer 212 may be removed through a chemical mechanical polishing (CMP) process, or the like. Thus, a first via 153A may be formed.

Figure 11D:
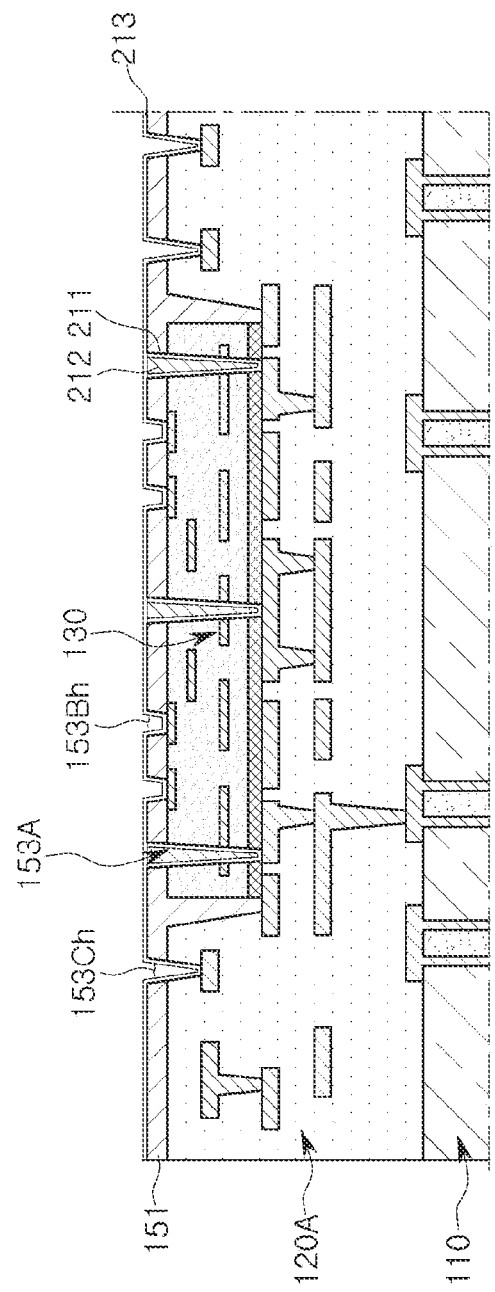

Referring to FIG. 11D, a second via hole 153Bh may be formed to penetrate through the insulating material 151 and a third via hole 153Ch may be formed to penetrate through the insulating material 151 and the first insulating layer 121A. In addition, a third metal layer 213 may be formed along surfaces of the insulating material 151 and the first via 153A and wall surfaces of the second via hole 153Bh and the third via hole 153Ch. The third metal layer 213 may be formed by electroless plating, and may serve as a seed layer.

Figure 11E:
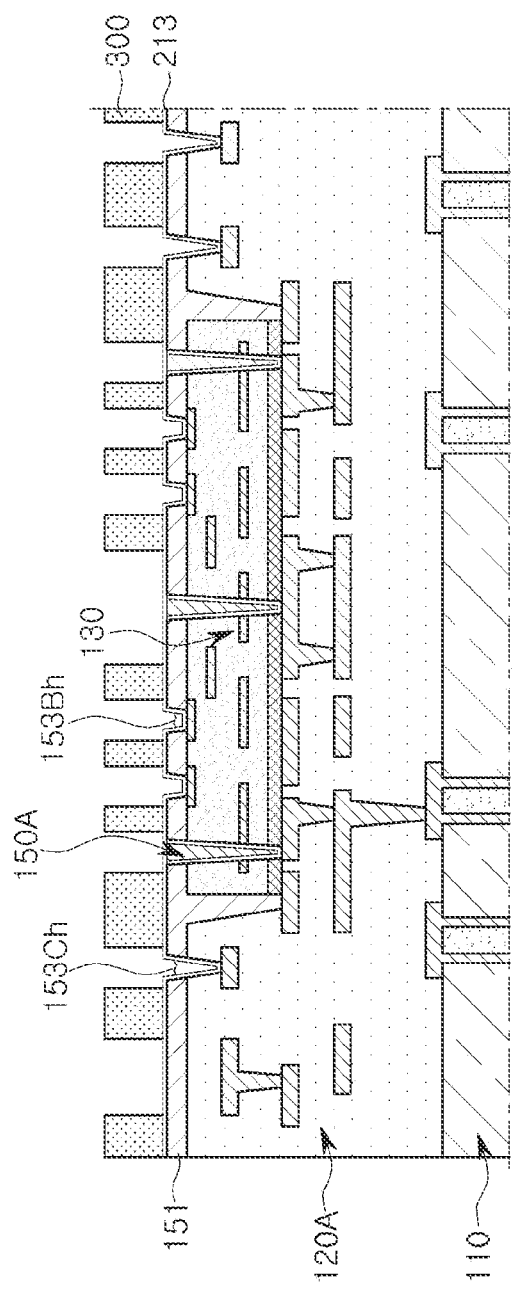

Referring to FIG. 11E, a photoresist layer 300 may be formed on the insulating material 151. In this case, an opening may be formed in the photoresist layer 300 in a region, in which a first via 153A, a second via 153B, a third via 153C, and a third circuit layer 152 are formed, through exposure and development processes.

Figure 11F:
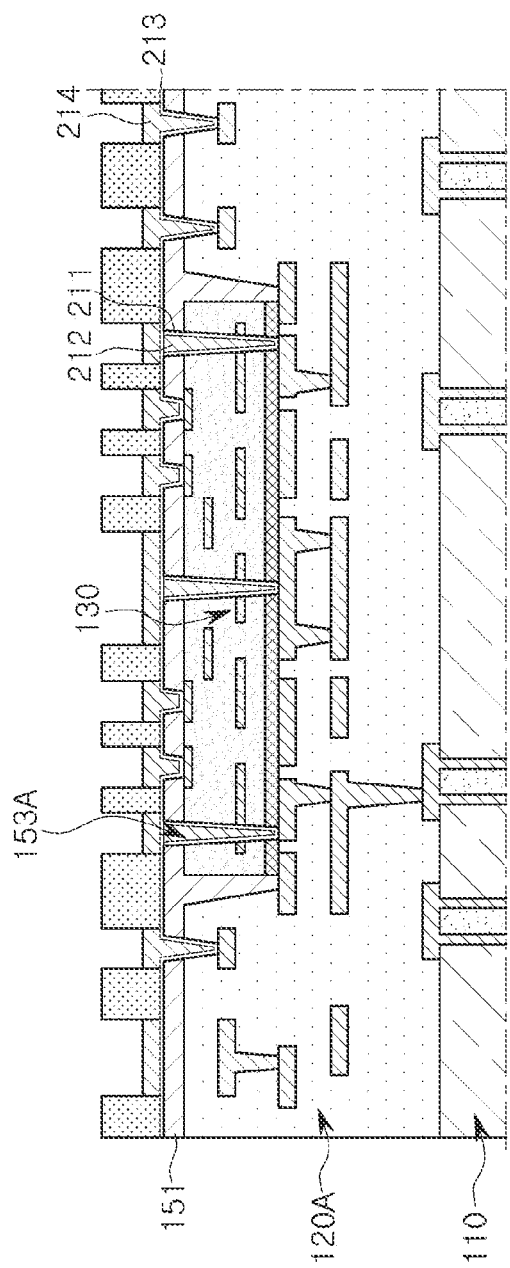

Referring to FIG. 11F, a fourth metal layer 214 may be formed on the third metal layer 213 in a region in which the second via 153B, the third via 153C, and the third circuit layer 152 are formed. The fourth metal layer 214 may be formed by electroplating.

Figure 11G:
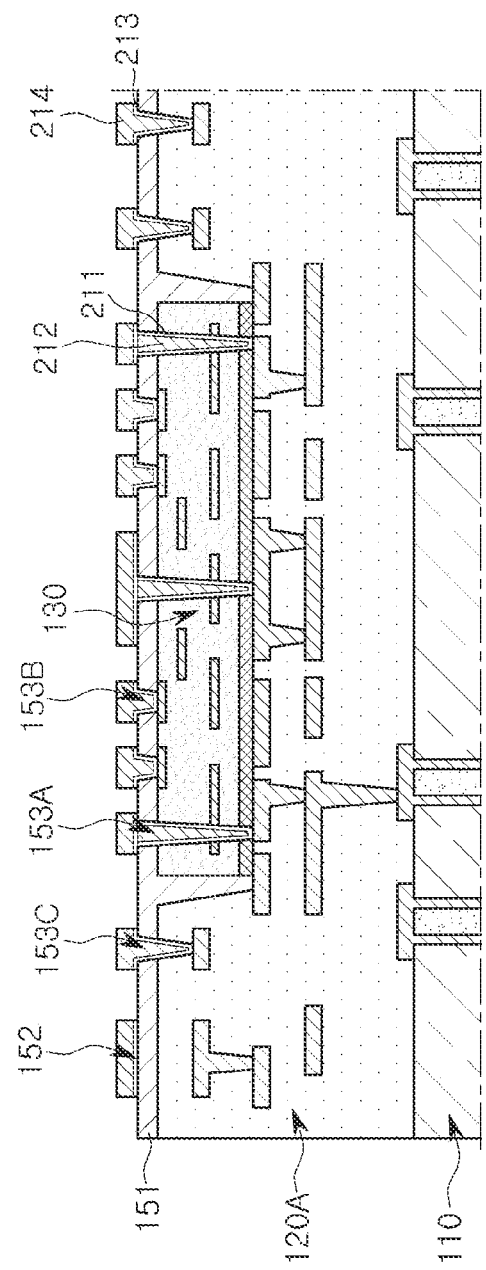

Referring to FIG. 11G, the photoresist layer 300 and the third metal layer 213, covered with the photoresist layer 300, may be removed. The photoresist layer 300 may be delaminated to be removed, and the third meal layer 213 may be etched to be removed.

In the manufacturing process according to another example, the first via 153A may include a first metal layer 211 and a second metal layer 212 disposed on the first metal layer 211. In addition, each of the third circuit layer 152, the second via 153B, and the third via 153C may include a third metal layer 213 and a fourth metal layer 214 disposed on the third metal layer 213. Each of the second via 153B and the third via 153C may be formed together with the third circuit layer 152 to be integrated with the third circuit layer 152.

Figure 12:
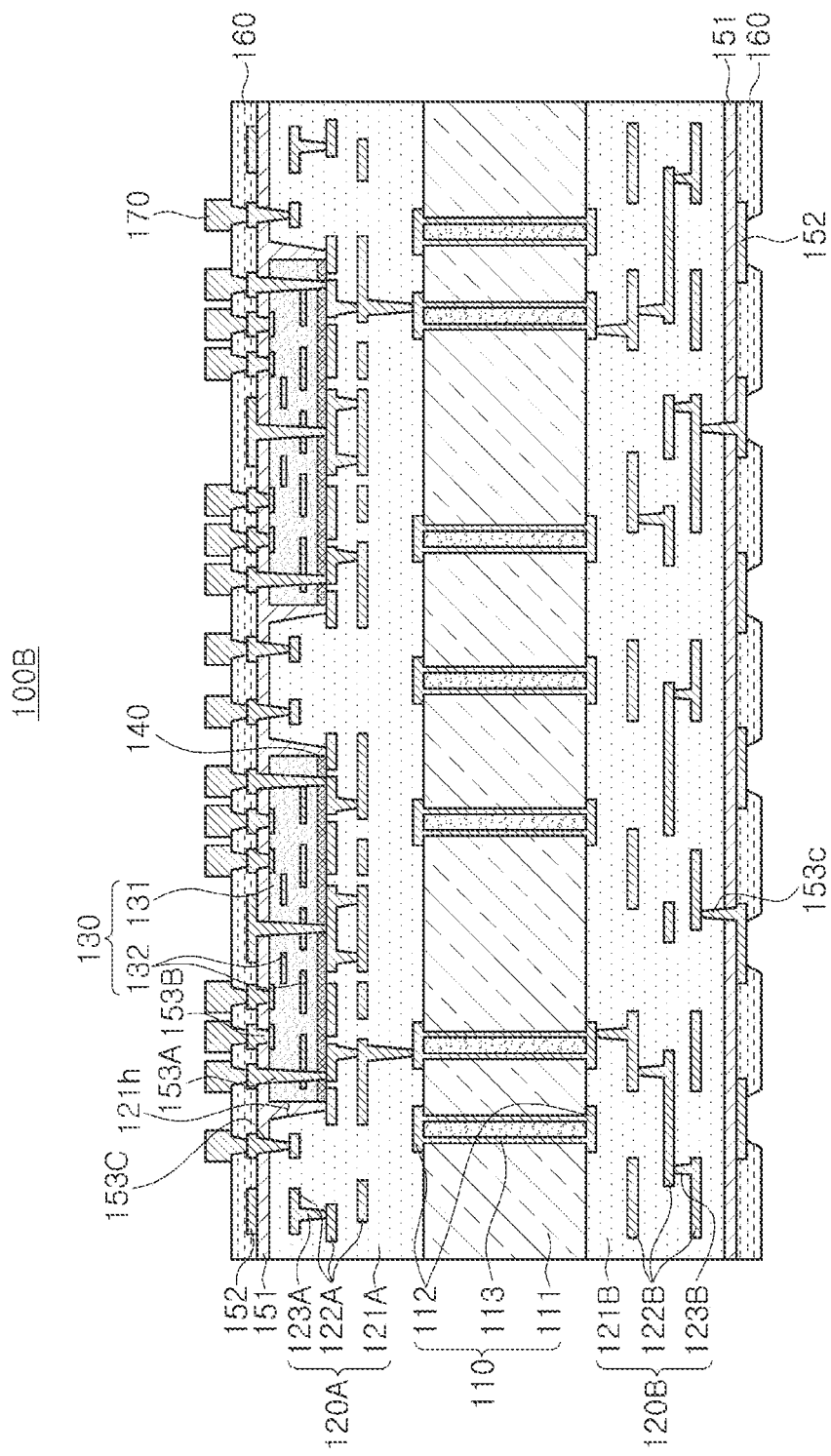
FIG. 12 is a schematic cross-sectional view illustrating another example of the printed circuit board according to the present disclosure.

FIG. 12 is a schematic cross-sectional view illustrating another example of the printed circuit board according to the present disclosure.

Referring to FIG. 12, in a printed circuit board 100B according to another exemplary embodiment, a bridge circuit layer 132 may include bridge circuit patterns having different shapes.

For example, the bridge circuit layer 132 may include both a ring-shaped bridge circuit pattern, having a region having a hole, and a bridge circuit pattern having an end portion in contact with a side surface of a first via 153A, described with reference to FIGS. 4 to 6. However, this is only an example for indicating that the bridge circuit pattern, included in the bridge circuit layer 132, may have various shapes, and the present disclosure is not limited to the above example.

Figure 13:
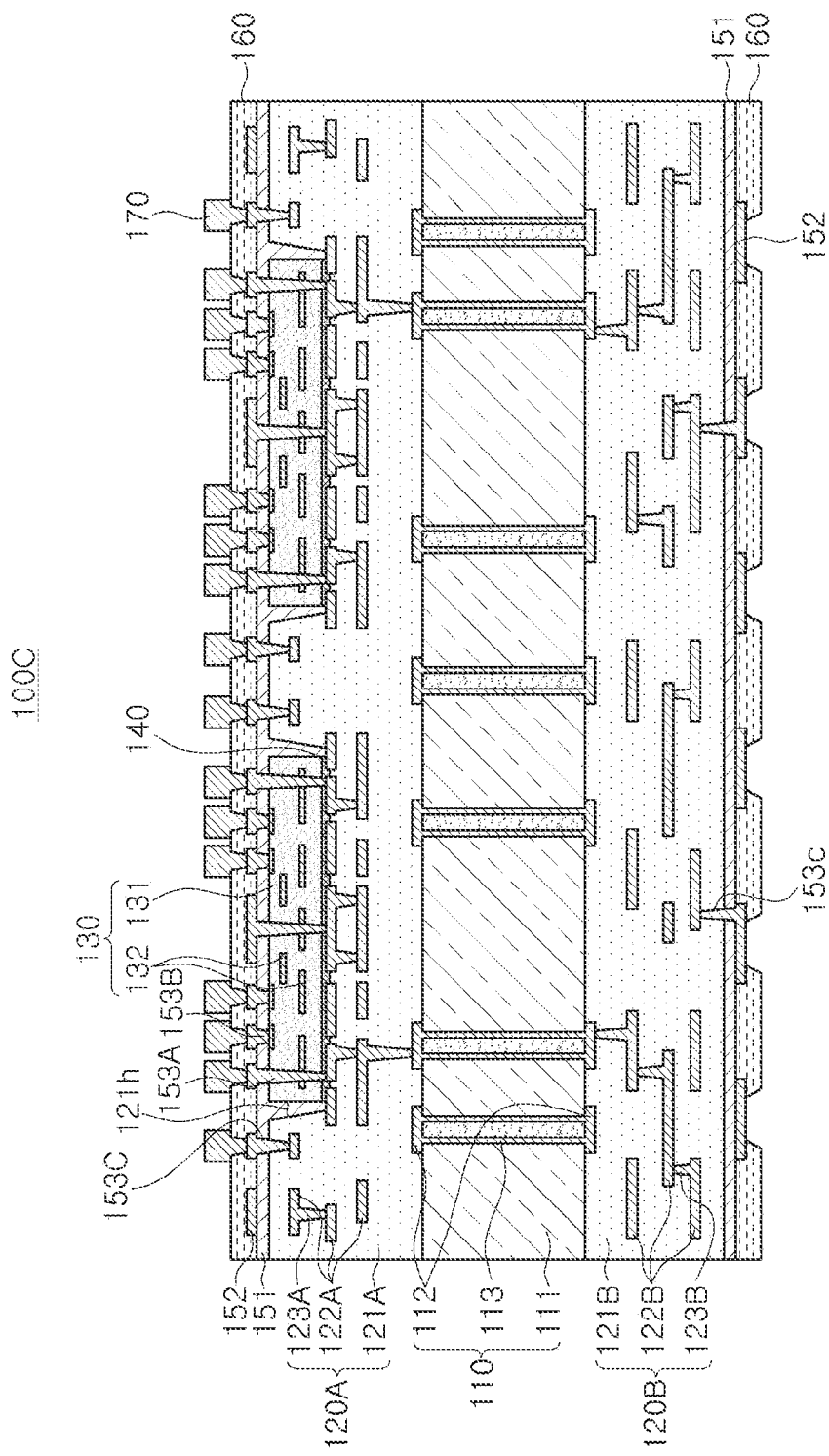
FIG. 13 is a schematic cross-sectional view illustrating another example of the printed circuit board according to the present disclosure.

FIG. 13 is a schematic cross-sectional view illustrating another example of the printed circuit board according to the present disclosure.

Referring to FIG. 13, in a printed circuit board 100C according to another exemplary embodiment, a bottom surface of a recess portion 121h may have a step with respect to one surface of a first circuit layer 122A exposed through a recess portion 121h. In FIG. 13, the bottom surface of the recess portion 121h is illustrated as being disposed on a level between one surface and the other surface of a circuit pad exposed through the recess portion 121h. However, the present disclosure is not limited thereto, and the bottom surface of the recess portion 121h may be disposed on a higher level than the other surface of the circuit pad exposed through the recess portion 121h.

An adhesive layer 140 may be disposed on the bottom surface of the recess portion to cover at least a portion of the circuit pad exposed through the recess portion 121h. For example, the adhesive layer 140 may be disposed on the bottom surface of the recess portion to cover a portion of each of one surface and a side surface of the circuit pad exposed through the recess portion 121h.

As described above, a circuit pad included in the first circuit layer 122A may serve as a processing stop layer during formation of the recess portion 121h. In this case, the first insulating layer 121A may be processed more deeply in a region in which the circuit pad is not disposed. Accordingly, similarly to the case of the printed circuit board 100C according to another exemplary embodiment, the bottom surface of the recess portion 121h may have a step with respect to one surface of the circuit pad of the first circuit layer 122A through the recess portion 121h. In addition, the bottom surface of the recess portion 121h may have an uneven structure. For example, the bottom surface in one region of the recess portion 121h may be disposed on a higher or lower level of the bottom surface in the other regions.

Figure 14:
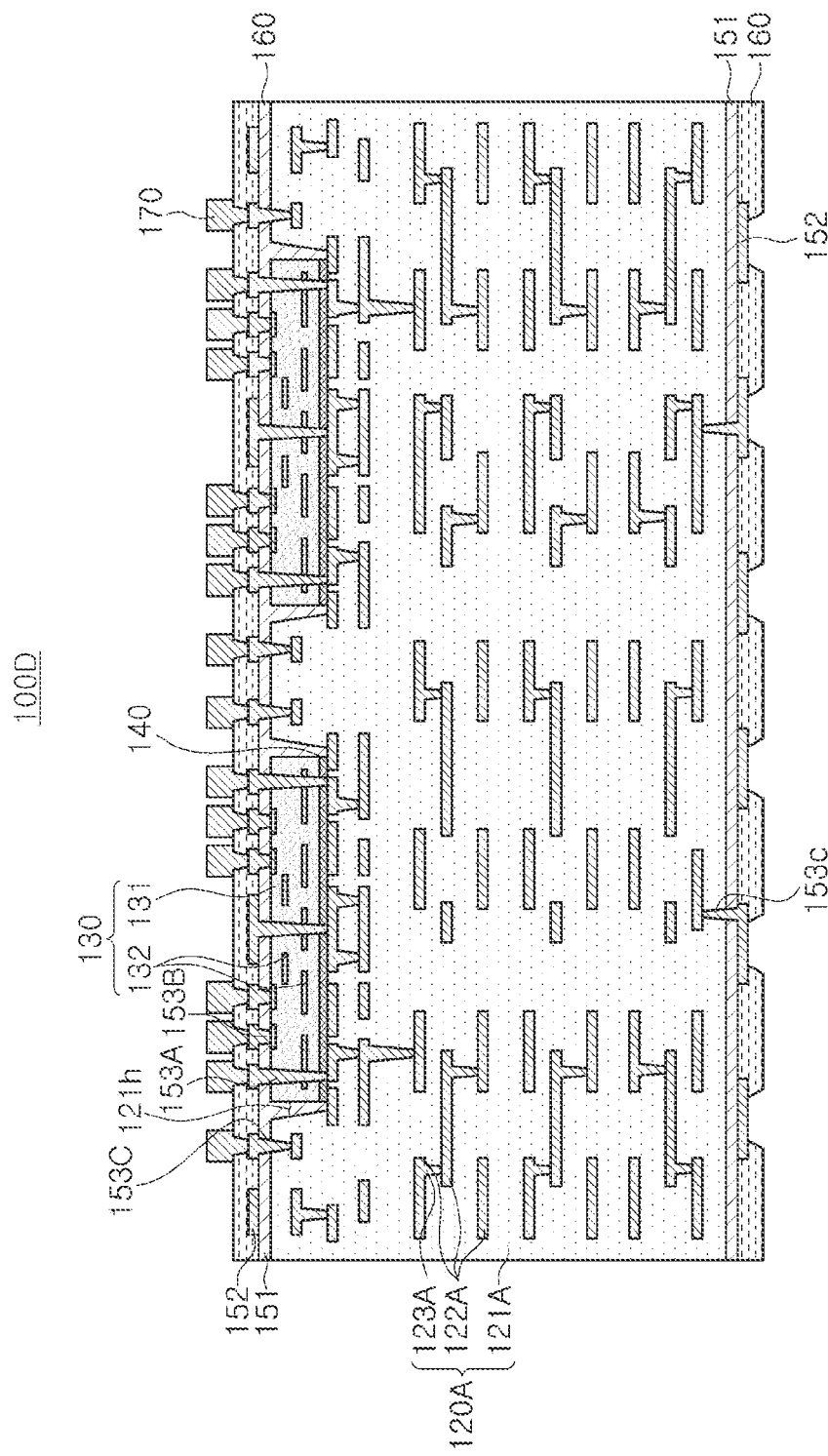
FIG. 14 is a schematic cross-sectional view illustrating another example of the printed circuit board according to the present disclosure.

FIG. 14 is a schematic cross-sectional view illustrating another example of the printed circuit board according to the present disclosure.

Referring to FIG. 14, the printed circuit board 100D according to another exemplary embodiment does not include a core substrate portion 110 and a second substrate portion 120B.

Accordingly, the printed circuit board 100D may include a first substrate portion 120A having a recess portion 121h, a bridge 130, an insulating material 151, a third circuit layer 152, a first via 153A, a second via 153B, and a third via 153C.

The other details are substantially the same as those described above in the description of the printed circuit board 100A according to an exemplary embodiment, and thus, detailed descriptions thereof will be omitted.

FIG. 15 is a schematic cross-sectional view illustrating another example of the printed circuit board according to the present disclosure.

Referring to FIG. 15, a second via 153B of a printed circuit board 100E according to another exemplary embodiment may penetrate through an insulating material 151 and a portion of a bridge 130 to be connected to a bridge circuit layer embedded in the bridge 130. In this case, as illustrated in the drawing, the second via 153B may penetrate through the insulating material 151 and a portion of the insulating layer 131.

The other details are substantially the same as those described above in the description of the printed circuit board 100A according to an exemplary embodiment, and thus, detailed descriptions thereof will be omitted.

Figure 16:
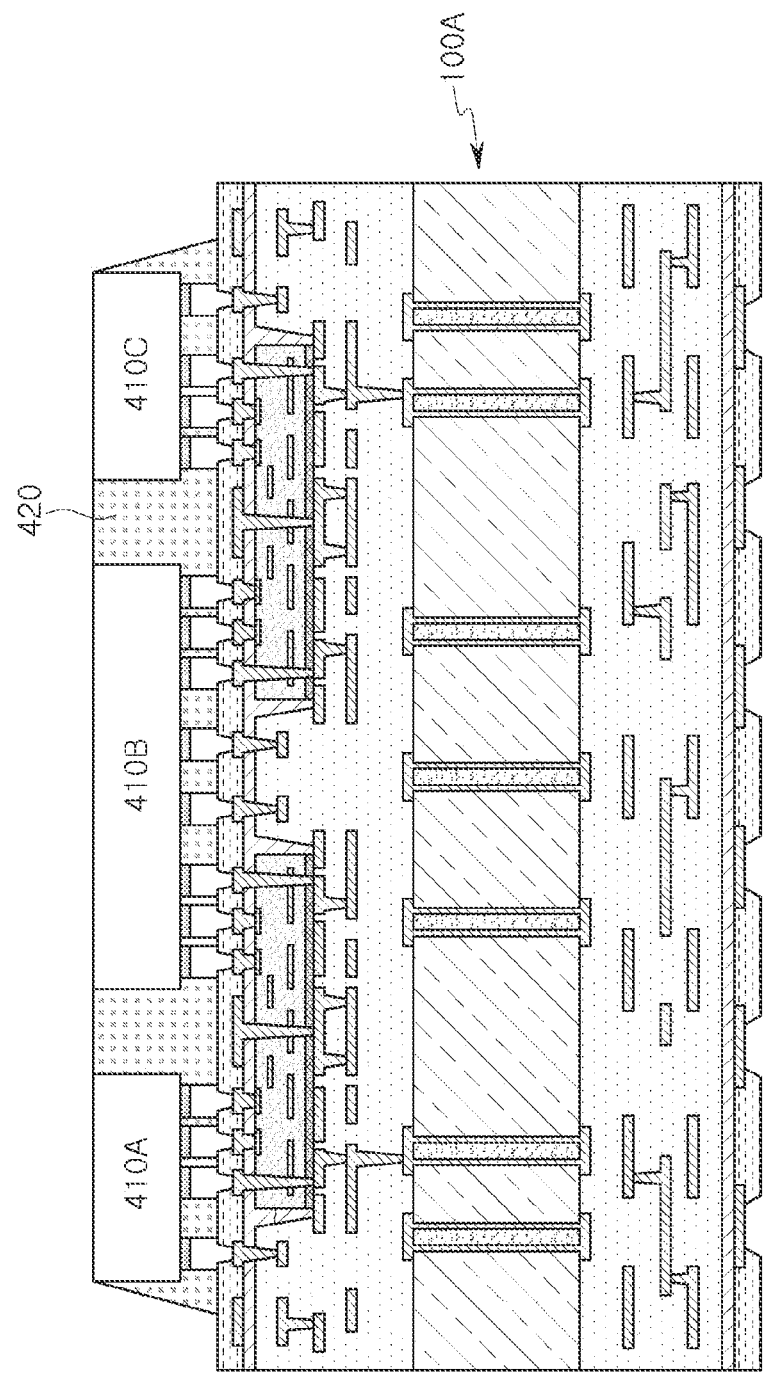
FIG. 16 is a schematic cross-sectional view illustrating an example of a multichip package in which a plurality of semiconductor chips are mounted on a printed circuit board according to the present disclosure.

FIG. 16 is a schematic cross-sectional view illustrating an example of a multichip package in which a plurality of semiconductor chips are mounted on a printed circuit board according to the present disclosure.

Referring to FIG. 16, a plurality of semiconductor chips 410A, 410B, and 410C may be disposed on a printed circuit board 100A according to an exemplary embodiment. The plurality of semiconductor chips 410A, 410B, and 410C may be fixed with a molding material 420.

The plurality of semiconductor chips 410A, 410B, and 410C may include a first semiconductor chip 410A, a second semiconductor chip 410B, and a third semiconductor chip 410C. However, the number of the semiconductor chips is not necessarily limited. For example, the semiconductor chips may include two semiconductor chips or four or more semiconductor chips.

Each of the first semiconductor chip 410A, the second semiconductor chip 410B, and the third semiconductor chip 410C may include a pad for connection to a connection conductor 170.

The bridge 130 may serve to connect at least two semiconductor chips, among the plurality of semiconductor chips, to each other. For example, the bridge 130 may include a plurality of bridges 130, and may include a bridge, connecting the first semiconductor chip 410A and the second semiconductor chip 410B to each other, and a bridge connecting the second semiconductor chip 410B and the third semiconductor chip 410C to each other.

Each of the first semiconductor chip 410A and the third semiconductor chip 410C may be a high bandwidth memory (HBM), and the second semiconductor chip 410B may include one of an application specific integrated circuit (ASIC), a field programmable gate array (FPGA), and a graphics processing unit (GPU).

Alternatively, each of the first semiconductor chip 410A and the third semiconductor chip 410C may be a high bandwidth memory (HBM), and the second semiconductor chip 410B may include at least one of an application specific integrated circuit (ASIC), a field programmable gate array (FPGA), and a graphics processing unit (GPU).

Alternatively, each of the first semiconductor chip 410A, the second semiconductor chip 410B, and the third semiconductor chip 410C may be an application specific integrated circuit (ASIC).

However, type of each of the first semiconductor chip 410A, the second semiconductor chip 410B, and the third semiconductor chip 410C is not limited to the above examples.

The term "connect" or "connection" in the present specification may be not only a direct connection, but also a concept including an indirect connection through an adhesive layer or the like. In addition, the term "electrically connected" or "electrical connection" in the present specification is a concept including both a physical connection and a physical non-connection.

Also, the expressions of "first," "second," and the like, in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression, an example, used in the present disclosure does not mean the same embodiment, but is provided for emphasizing and explaining different unique features. However, the above-mentioned examples or embodiments do not exclude being implemented in combination with the features of other examples. For example, although the description in the specific example is not described in another example, it may be understood as an explanation related to another example, unless otherwise described or contradicted by the other example.

The terms used in this inventive concept are only used to illustrate an example and are not intended to limit the present disclosure. The singular expressions include plural expressions unless the context clearly dictates otherwise.

As described above, a printed circuit board, in which a bridge including a high-density circuit layer is embedded, and a method of manufacturing the printed circuit board may be provided.

In addition, a printed circuit board, capable of significantly reducing an electrical connection path by directly connecting a circuit layer of the printed circuit board and a bridge circuit layer of a bridge embedded in the printed circuit board, and a method of manufacturing the printed circuit board may be provided.

While exemplary embodiments have been shown and described above, it will be apparent to those skilled in the art that modifications and variations could be made without departing from the scope of the present disclosure as defined by the appended claims.

What is claimed is:

1. A printed circuit board comprising:
    a substrate portion having a recess portion and including a first circuit layer;
    a bridge disposed in the recess portion and including an insulating layer and a bridge circuit layer;
    an insulating material disposed in at least a portion of the recess portion and covering at least a portion of the bridge;
    a second circuit layer disposed on the insulating material; and
    a first via penetrating through the insulating material and a portion of the bridge and connecting the second circuit layer and the bridge circuit layer to each other.

2. The printed circuit board of claim 1, wherein the bridge circuit layer has a higher density than the first circuit layer.

3. The printed circuit board of claim 1, further comprising:
    a second via penetrating through the insulating material and the bridge and connecting the second circuit layer and the first circuit layer to each other.

4. The printed circuit board of claim 3, wherein the bridge circuit layer includes a bridge circuit pattern in contact with a side surface of the second via.

5. The printed circuit board of claim 4, wherein the bridge circuit pattern surrounds the side surface of the second via in a region in which the bridge circuit pattern is in contact with the side surface of the second via.

6. The printed circuit board of claim 4, wherein the bridge circuit pattern surrounds the side surface of the second via in a region in which the bridge circuit pattern is in contact with the side surface of the second via.

7. The printed circuit board of claim 4, wherein the second via has a step from an interface of the second via and the insulating layer of the bridge to an interface of the second via and a side surface of the bridge circuit pattern.

8. The printed circuit board of claim 1, wherein the first circuit layer includes a circuit pad disposed in at least a region of a bottom surface of the recess portion.

9. The printed circuit board of claim 8, wherein the circuit pad includes a plurality of circuit pads, and
    the plurality of circuit pads are disposed to be spaced apart from each other.

10. The printed circuit board of claim 8, wherein the circuit pad has at least one hole.

11. The printed circuit board of claim 1, further comprising:
    an adhesive layer disposed between a bottom surface of the recess portion and the bridge.

12. A method of manufacturing a printed circuit board, the method comprising:
    forming a recess portion in a substrate portion including a first circuit layer;
    disposing a bridge, including an insulating layer and a bridge circuit layer, in the recess portion;
    forming an insulating material to fill at least a portion of the recess portion and to cover at least a portion of the bridge;
    forming a second circuit layer on the insulating material; and
    forming a first via penetrating through the insulating material and a portion of the bridge to connect the second circuit layer to the bridge circuit layer.

13. The method of claim 12, further comprising:
    forming a second via penetrating through the insulating material and the bridge to be connected to the first circuit layer.

14. The method of claim 13, wherein the forming of the second via includes forming a via hole to expose at least a portion of a side surface of a bridge circuit pattern included in the bridge circuit layer.

15. The method of claim 14, wherein the bridge circuit pattern has a region having a hole, and
    the via hole penetrates through a region, corresponding to the hole, and exposes at least a portion of the side surface of the bridge circuit pattern.

16. The method of claim 12, wherein in the forming of the recess portion, the recess portion exposes at least a portion of a circuit pad included in the first circuit layer.

17. The method of claim 12, wherein in the disposing of the bridge, the bridge is disposed in the recess portion through an adhesive layer.

18. A printed circuit board comprising:
    a substrate portion having a recess portion and including a first circuit layer;
    a bridge disposed in the recess portion and including an insulating layer and a bridge circuit layer;
    an insulating material disposed in at least a portion of the recess portion and covering at least a portion of the bridge;
    a second circuit layer disposed on the insulating material, the bridge being disposed between the second circuit layer and the first circuit layer; and
    a first via connecting the first circuit layer and the bridge circuit layer to each other,
    wherein the first via penetrates through the bridge and a portion of the insulating material disposed on the bridge to connect the second circuit layer to each of the first circuit layer and the bridge circuit layer.

19. The printed circuit board of claim 18, further comprising:
    one or more second vias extending from the second circuit layer to the bridge or a portion of the printed circuit board outside the recess portion to connect the second circuit layer to one of a circuit layer in the bridge or a circuit layer in the printed circuit board outside the recess portion.

20. The printed circuit board of claim 19, wherein a depth of the first via is different from a depth of the one or more second vias.

21. The printed circuit board of claim 18, further comprising:
    an adhesive layer disposed between the bridge and the first circuit layer, and
    the first via penetrates through the adhesive layer.

22. The printed circuit board of claim 18, wherein the first via has a step from an interface of the first via and the insulating layer of the bridge to an interface of the first via and a side surface of a bridge circuit pattern of the bridge circuit layer.

23. A method of manufacturing a printed circuit board, the method comprising:
    forming a recess portion in a substrate portion to expose a first circuit layer of the substrate portion;

disposing a bridge, including an insulating layer and a bridge circuit layer, in the recess portion;

forming an insulating material to fill at least a portion of the recess portion and to cover at least a portion of the bridge;

forming a first via to connect to the bridge circuit layer to the first circuit layer; and forming a second circuit layer on the insulating material, wherein the first via is formed to extend from the second circuit layer through a portion of the insulating material disposed on the bridge and the bridge to connect the second circuit layer to each of the bridge circuit layer and the first circuit layer.

24. The method of claim 23, further comprising forming one or more second vias extending from the second circuit layer to the bridge or a portion of the printed circuit board outside the recess portion to connect the second circuit layer to one of a circuit layer in the bridge or a circuit layer in the printed circuit board outside the recess portion.

25. The method of claim 24, wherein the first via and the one or more second vias are formed simultaneously.

26. The method of claim 24, wherein the one or more second vias are formed after forming the first via.

\* \* \* \* \*